US009455667B2

(12) United States Patent
Vlachogiannakis et al.

(10) Patent No.: US 9,455,667 B2
(45) Date of Patent: Sep. 27, 2016

(54) FRACTIONAL-N ALL DIGITAL PHASE LOCKED LOOP INCORPORATING LOOK AHEAD TIME TO DIGITAL CONVERTER

(71) Applicants: Gerasimos S. Vlachogiannakis, Delft (NL); Augusto Ronchini Ximenes, Den Haag (NL); Robert Bogdan Staszewski, Dublin (IE)

(72) Inventors: Gerasimos S. Vlachogiannakis, Delft (NL); Augusto Ronchini Ximenes, Den Haag (NL); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 0 days.

(21) Appl. No.: 14/831,781

(22) Filed: Aug. 20, 2015

(65) Prior Publication Data
US 2016/0056825 A1 Feb. 25, 2016

Related U.S. Application Data

(60) Provisional application No. 62/039,481, filed on Aug. 20, 2014.

(51) Int. Cl.
*H03M 1/82* (2006.01)
*H03B 5/12* (2006.01)
(Continued)

(52) U.S. Cl.
CPC ........... *H03B 5/1265* (2013.01); *G04F 10/005* (2013.01); *H03B 1/00* (2013.01); *H03B 5/1215* (2013.01); *H03B 5/1228* (2013.01); *H03B 5/1296* (2013.01); *H03K 3/015* (2013.01);
(Continued)

(58) Field of Classification Search
CPC .... H03M 1/60; H03M 1/0836; H03M 1/002; H03L 2207/50; H03L 2207/06; H03L 7/18; H03L 7/091; H03L 7/1976; H03L 7/095; H03L 7/0893
USPC ............ 341/143, 166; 327/8, 105, 156, 159; 331/1 A, 1 R, 16, 17, 25, 34, 57
See application file for complete search history.

(56) References Cited

U.S. PATENT DOCUMENTS 7,304,510 B2 * 12/2007 Matsuta ............... H03D 13/004
327/3
7,817,747 B2 * 10/2010 Waheed ................... H03C 5/00
375/298
(Continued)

OTHER PUBLICATIONS

Huang, Y. C. et al., "A 2.4GHz ADPLL with Digital-Regulated Supply-Noise-Insensitive and Temperature-Self-Compensated Ring DCO", ISSCC 2014, pp. 270-271, Feb. 2014.
(Continued)

*Primary Examiner* — Linh Nguyen
(74) *Attorney, Agent, or Firm* — Zaretsky Group PC; Howard Zaretsky, Esq.

(57) ABSTRACT

A novel and useful look-ahead time to digital converter (TDC) that is applied to an all digital phase locked loop (ADPLL) as the fractional phase error detector. The deterministic nature of the phase error during frequency/phase lock is exploited to achieve a reduction in power consumption of the TDC. The look-ahead TDC circuit is used to construct a cyclic DTC-TDC pair which functions to reduce fractional spurs of the output spectrum in near-integer channels by randomly rotating the cyclic DTC-TDC structure so that it starts from a different point every reference clock thereby averaging out the mismatch of the elements. Associated rotation and dithering methods are also presented. The ADPLL is achieved using the look-ahead TDC and/or cyclic DTC-TDC pair circuit.

20 Claims, 17 Drawing Sheets

(51) Int. Cl.
| | |
|---|---|
| H03B 1/00 | (2006.01) |
| H03K 3/015 | (2006.01) |
| G04F 10/00 | (2006.01) |
| H03L 7/08 | (2006.01) |
| H03M 1/00 | (2006.01) |
| H03L 7/093 | (2006.01) |
| H03M 1/20 | (2006.01) |
| H03L 7/089 | (2006.01) |
| H03L 7/197 | (2006.01) |
| H03K 3/03 | (2006.01) |

(52) U.S. Cl.
CPC ........... *H03K3/0315* (2013.01); *H03L 7/0802* (2013.01); *H03L 7/0893* (2013.01); *H03L 7/093* (2013.01); *H03L 7/1976* (2013.01); *H03M 1/002* (2013.01); *H03M 1/201* (2013.01); *H03J 2200/10* (2013.01); *H03L 2207/50* (2013.01)

(56) References Cited

U.S. PATENT DOCUMENTS

| | | | | |
|---|---|---|---|---|
| 8,085,074 B1* | 12/2011 | Janardhanan | ............. | H03L 7/10 327/149 |
| 8,339,295 B2* | 12/2012 | Nagaraj | .................. | H03B 21/02 327/105 |
| 8,536,915 B1* | 9/2013 | Terrovitis | .................... | H03L 7/16 327/147 |
| 2002/0101271 A1* | 8/2002 | Tanahashi | ............... | H03K 5/131 327/279 |
| 2007/0075785 A1* | 4/2007 | Kossel | ..................... | H03L 7/089 331/16 |
| 2007/0110194 A1* | 5/2007 | de Obaldia | ............. | H03L 7/091 375/345 |
| 2009/0004981 A1* | 1/2009 | Eliezer | .................. | H03F 1/0211 455/127.1 |
| 2009/0028274 A1* | 1/2009 | Kim | ......................... | G04F 10/06 375/340 |
| 2010/0188148 A1* | 7/2010 | Mehta | ................... | H03F 1/3247 330/149 |
| 2012/0268184 A1* | 10/2012 | Baumann | ............... | H03K 5/135 327/277 |
| 2014/0002288 A1* | 1/2014 | Scholz | .................... | H03M 1/66 341/144 |

OTHER PUBLICATIONS

Gao, X. et al., "A 2.2GHz Sub-Sampling PLL with 0.16psrms Jitter and -125dBc/Hz In-band Phase Noise at 700µW Loop-Components Power", Symp. VLSI Circuits, pp. 139-140, 2010.

Ru, Z. et al., "A 12GHz 210fs 6mW Digital PLL with Sub-sampling Binary Phase Detector and Voltage-Time Modulated DCO", Symposium on VLSI Circuits, pp. C194-C195, 2013.

Kuo, F. W. et al., "A 12mW All-Digital PLL Based on Class-F DCO for 4G Phones in 28 nm CMOS", Symposium on VLSI Circuits, pp. 1-2, 2014.

Markulic, N. et al., "A 10-bit, 550-fs step Digital-to-Time Converter in 28nm CMOS", European Solid State Circuits Conf. (ESSCIRC), pp. 79-82, 2014.

Ahmadi,M.R. et al.,"A 288fs RMS Jitter Versatile 8-12.4GHz Wide-Band Fractional-N Synthesizer for SONET and SerDes Comm Standards in 40nm CMOS",VLSIC,pp. C160-C161,2013.

Gao, X et al., "Jitter Analysis and a Benchmarking Figure-of-Merit for Phase-Locked Loops", IEEE Trans. Circ. and Systems II, vol. 56, No. 2, pp. 117-121, 2009.

Huang, Y. C. et al., "A 2.4GHz ADPLL with Digital-Regulated Supply-Noise-Insensitive and Temperature-Self-Compensated Ring DCO", ISSCC, pp. 270-271, 2014.

Marucci, G et al., "1.7GHz MDLL-Based Fractional-N Frequency Synthesizer with 1.4ps RMS Integrated Jitter and 3mW Power Using a 1b TDC", ISSCC, pp. 360-361, 2014.

Min, S. et al.,"A 90-nm CMOS 5-GHz Ring-Oscillator PLL with Delay-Discriminator-Based Active Phase-Noise Cancellation",IEEE J.Solid-State Circ.,vol. 48,No. 5, pp. 1151-1160,2013.

Raczkowski, K. et al., "A 9.2-12.7 GHz Wideband Fractional-N Subsampling PLL in 28 nm CMOS with 280 fs RMS jitter", IEEE J. Solid-State Circ., vol. 50, No. 5,pp. 1203-1213,2015.

Kao, T. K. et al., "A Wideband Fractional-N Ring PLL with Fractional-Spur Suppression Using Spectrally Shaped Segmentation", ISSCC, pp. 416-417, 2013.

Venerus, C. et al., "A TDC-Free Mostly-Digital FDC-PLL Frequency Synthesizer with a 2.8-3.5 GHz DCO", IEEE J. Solid-State Circ., vol. 50, No. 2, pp. 450-463, Feb. 2015.

Tierno, J. A. et al., "A Wide Power Supply Range, Wide Tuning Range, All Static CMOS All Digital PLL in 65 nm SOI", IEEE J. Solid-State Circ., vol. 43, No. 1, pp. 42-51, 2008.

Xu, L. et al., "A 2.4-GHz Low-Power All-Digital Phase-Locked Loop", IEEE J. Solid-State Circ., vol. 45, No. 8, pp. 1513-1521, Aug. 2010.

Levantino, S. et al., "An Adaptive Pre-Distortion Technique to Mitigate the DTC Nonlinearity in Digital PLLs", IEEE J. Solid-State Circ., vol. 49, No. 8, pp. 1762-1772, 2014.

Chung, H. et al., "A 10-Bit 80-MS/s Decision-Select Successive Approximation TDC in 65-nm CMOS", IEEE J. Solid-State Circ., vol. 47, No. 5, pp. 1232-1241, 2012.

Elshazly, A. et al.,"A 1.5GHz 890µW Digital MDLL with 400fsrms Integrated Jitter,-55.6dBc Reference Spur and 20fs/mV Supply-Noise Sensitivity Using 1b TDC",ISSCC2012, 242-243.

Henzler, S. et al.,"90nm 4.7ps-Res. 0.7-LSB Single-Shot Precision and 19pJ-per-Shot Local Passive Interp. TDC with On-Chip Characterization",ISSCC 2008, pp. 548-635, Feb. 2008.

Hsu, C.M. et al.,"A Low-Noise Wide-BW 3.6-GHz Digital Sigma-Delta Fract-N Freq Synth with Noise-Shaping TDC and Quant Noise Cancellation", IEEE JSSC,vol. 43, No. 12, Dec. 2008.

Aleksić, M., "A 3.2-GHz 1.3-mW ILO Phase Rotator for Burst-Mode Mobile Memory I/O in 28-nm Low-Leakage CMOS", ESSCIRC 2014, pp. 451-454, Sep. 2014.

Kim, S.J. et al.,"A 0.6V 1.17ps PVT-Tolerant and Synthesizable TDC Using Stochastic Phase Interp with 16x Spatial Redundancy in 14nm FinFET Tech",ISSCC 2015, pp. 393-395,2015.

Lee, S.K. et al., "A 1GHz ADPLL with a 1.25ps Minimum-Resolution Sub-Exponent TDC in 0.18µm CMOS", ISSCC 2010, pp. 482-483, 2010.

Lee, M. et al., "A 9 b, 1.25 ps Resolution Coarse—Fine Time-to-Digital Converter in 90 nm CMOS that Amplifies a Time Residue", IEEE JSSC, vol. 43, No. 4, pp. 769-777, Apr. 2008.

Samarah, A. et al., "A Digital Phase-Locked Loop With Calibrated Coarse and Stochastic Fine TDC", IEEE JSSC, vol. 48, No. 8, pp. 1829-1841, Aug. 2013.

Marzin, G. et al., "A Spur Cancellation Technique for MDLL-based Frequency Synthesizers", IEEE ISCAS 2013, pp. 165-168, 2013.

Straayer, M.Z. et al., "An efficient high-resolution 11-bit noise-shaping multipath gated ring oscillator TDC", IEEE Symp VLSI Circ. 2008, pp. 82-83, 2008.

Seo, Y.H. et al., "A 0.63ps Resolution, 11b Pipeline TDC in 0.13um CMOS", Symp on VLSI Circ 2011, pp. 152-153, 2011.

Yousif, A.S. et al., A Fine Resolution TDC Architecture for Next Generation PET Imaging, IEEE Trans. Nuclear Science, vol. 54, No. 5, pp. 1574-1582, Oct. 2007.

Yu, J. et al., "A 12-Bit Vernier Ring Time-to-Digital Converter in 0.13 ?m CMOS Technology", IEEE JSSC, vol. 45, No. 4, pp. 830-842, Apr. 2010.

Zhuang, J. et al., "A Low-Power All-Digital PLL Architecture Based on Phase Prediction", IEEE ICECS 2012, pp. 797-800, 2012.

\* cited by examiner

FRACTIONAL-N ALL DIGITAL PHASE LOCKED LOOP INCORPORATING LOOK AHEAD TIME TO DIGITAL CONVERTER

REFERENCE TO PRIORITY APPLICATION

This application claims priority to U.S. Provisional Application Ser. No. 62/039,481, filed Aug. 20, 2014, entitled "Low-Q Transformer-Based Oscillator," incorporated herein by reference in its entirety.

FIELD OF THE INVENTION

The present invention relates generally to phase locked look circuits and in particular to a fractional-N all digital phase locked loop incorporating a look-ahead time to digital converter circuit.

BACKGROUND OF THE INVENTION

All-digital phase locked loop (ADPLL) circuits are in wide spread use today. An ADPLL incorporates a digital phase detector, filter and oscillator. Some ADPLLs utilize a delay line based time to digital converter (TDC) in determining the phase error. Traditional ADPLL implementations, however, tend to consume a considerable amount of power, since the TDC has to cover at least one variable clock period. As an example, if the minimum variable clock frequency is 1 GHz then the time-to-digital converter (TDC) has to cover 1000 ps, which corresponds to 100 inverters at the fastest delay of 10 ps. Simulations indicate that at the maximum frequency end of 2 GHz, a 100-inverter TDC chain consumes 10 mW at 2 GHz, which may comprise the entire ADPLL power budget.

There is thus a need for a circuit that solves the problem of increased power consumption of the TDC circuit in ADPLLs.

Further, another problem associated with conventional ADPLL circuits that utilize delay line TDCs is that they generate fractional spurs in the output. These spurs are particularly visible at near-integer channels and deteriorate the synthesizer performance expressed by the integrated phase noise. For high capacity modulation schemes in wireless communication, a low integrated phase noise (IPN) is required and near-integer channels cannot be avoided in highly reconfigurable ADPLLs that are to be used in software defined radios (SDR).

There is thus a need for an ADPLL circuit that is capable of reducing fractional spurs of the output spectrum in near-integer channels while maintaining desired performance levels.

SUMMARY OF THE INVENTION

The present invention provides a look-ahead time to digital converter (TDC) that is applied to an all digital phase locked loop (ADPLL) as the fractional phase error detector. The deterministic nature of the phase error during frequency/phase lock is exploited. The look-ahead TDC circuit is used to construct a cyclic DTC-TDC pair which functions to reduce fractional spurs of the output spectrum in near-integer channels. A significant reduction in power consumption of the ADPLL is achieved using the look-ahead TDC and/or cyclic DTC-TDC pair circuit. The cyclic DTC-TDC circuit pair is operative to mitigate fractional spurs in the output of the ADPLL. Associated rotation and dithering methods are also presented.

In the cyclic DTC-TDC pair circuit the mismatch-induced spurs are reduced by randomly rotating the cyclic DTC-TDC structure so that it starts from a different point every reference clock thereby averaging out the mismatch of the elements in order to reduce the frequency spurs. In addition, quantization spurs are reduced by dithering the DTC control code.

The advantage of the cyclic DTC-TDC is that it can achieve spur reduction without any advanced calibration technique and characterization of the TDC, but rather by introducing dynamic element matching to the DTC-TDC pair. The DTC portion makes it possible to inject the reference edge to the phase detector from any point, which is not possible in prior art TDC structures. Additionally, the entire circuit operates at the reference rate (on the order of MHz) due to the added functionality of TDC clock gating.

The look-ahead TDC and cyclic DTC-TDC architectures can be incorporated into numerous applications. Example applications include RF systems-on-chip (SoCs) for RF applications such as Wi-Fi/WiMax, or any emerging application requiring high capacity modulation schemes, wide range of output channels, wide-band modulation and/or reduced power consumption of the frequency synthesizer. In addition, the cyclic DTC-TDC is scalable and exhibits improved results in advanced semiconductor processes.

There is therefore provided in accordance with the invention, a look-ahead time to digital converter (TDC) for use in an all digital phase locked loop (ADPLL), comprising a plurality of controllable delay elements configured in a sequential chain configuration, and a phase prediction circuit coupled to a frequency reference (FREF) clock and operative to predict reference frequency clock edge timing and based thereon to select a number of delay elements in the chain to function as a digital to time converter and a portion of a remainder of delay elements in the chain to function as a time to digital converter.

There is also provided in accordance with the invention, a look-ahead time to digital converter (TDC) for use in an all digital phase locked loop (ADPLL) circuit, comprising a phase prediction circuit coupled to a frequency reference (FREF) clock and operative to predict reference frequency clock edge timing and to generate a delayed frequency reference clock therefrom aligned with a variable clock (CKV), a plurality of controllable delay elements coupled to the look-ahead circuit, the plurality of delay elements configured in a sequential chain configuration, the delay element chain operative to receive the delayed frequency reference clock and to propagate a single disturbance pulse through a number of delay elements determined by the phase prediction circuit that function as a time to digital converter, and wherein the plurality of controllable delay elements are operative to generate an output code representing a fractional portion of a phase error used by the ADPLL to adjust the frequency of the variable clock.

There is further provided in accordance with the invention, a method of look-ahead time to digital conversion for use in an all digital phase locked loop (ADPLL), the method comprising predicting reference frequency (FREF) clock edge timing and generating a delayed frequency reference clock therefrom, providing a plurality of controllable delay elements configured in a sequential chain configuration, based on the reference frequency clock prediction, selecting at every frequency reference clock a number of delay elements in the chain to function as a digital to time converter and a portion of a remainder of delay elements in the chain to function as a time to digital converter.

BRIEF DESCRIPTION OF THE DRAWINGS

The invention is herein described, by way of example only, with reference to the accompanying drawings, wherein.

DETAILED DESCRIPTION OF THE INVENTION

The present invention provides a look-ahead time to digital converter (TDC) that is applied to an all digital phase locked loop (ADPLL) as the fractional phase error detector. The look-ahead TDC circuit is used to construct a cyclic DTC-TDC pair which functions to reduce fractional spurs of the output spectrum in near-integer channels. The invention is applicable to and described in the context of an ADPLL. A significant reduction in power consumption of the ADPLL is achieved using the cyclic DTC-TDC pair circuit. The circuit incorporates phase prediction, TDC clock gating and reference clock retiming and gain estimation of the DTC-TDC pair. The cyclic DTC-TDC circuit pair is operative to mitigate fractional spurs. Associated rotation and dithering methods are also presented.

Figure 1:
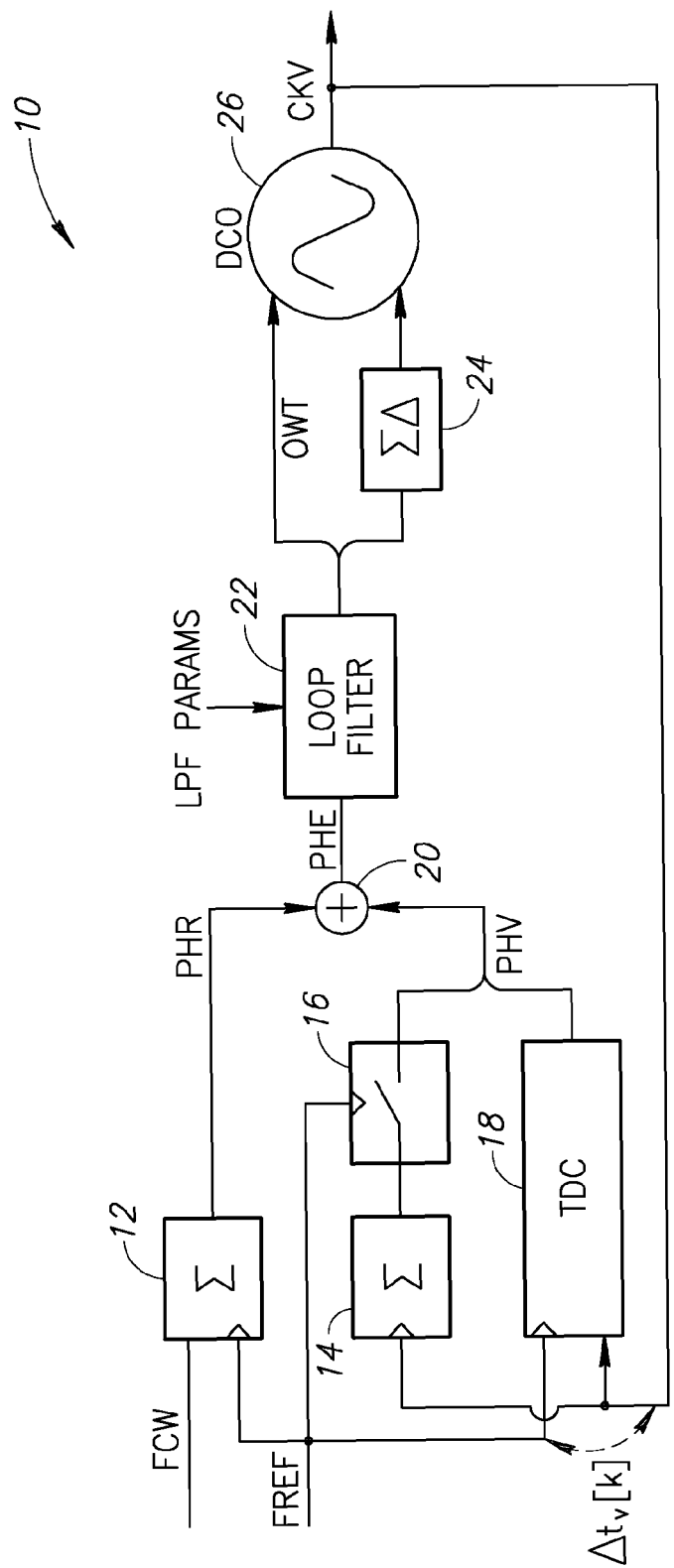
FIG. 1 is a block diagram illustrating an example phase domain (accumulator based) ADPLL.

A block diagram illustrating an example phase-domain (i.e. accumulator based) ADPLL is shown in FIG. 1. The phase-domain ADPLL, generally referenced 10, generates the reference frequency clock (FREF) and variable clock (CKV) phases utilizing two accumulators 12, 14. The reference accumulator 12 generates the reference phase PHR by accumulating the frequency command word (FCW). The FCW is defined as the ratio between the desired output frequency $f_V$ and the input reference frequency $f_R$:

$$FCW = \frac{f_V}{f_R} \tag{1}$$

The FCW, and thus PHR, can be a fractional number limited only by the number of bits.

The variable phase accumulator (also referred to as a variable counter) counts the CKV edges in order to produce the integer part of the variable phase (PHV). PHR and PHV are signals from two different clock domains, the reference and the variable domains, respectively, which are generally not synchronized. Since the variable clock is the faster one, it is used to resample the reference clock in order for the retimed reference clock (CKR) to be created. That clock is used to sample the output of the variable counter and clock the variable phase accumulator. That way, the PHR and PHV outputs are of the same clock domain and can be subtracted digitally via subtractor 20. This subtraction resolves the integer part of the phase error and a TDC 18 is needed to resolve the fractional part of the phase error. The total phase error is filtered by a loop filter 22 and used to control a digitally controlled oscillator (DCO) 26 towards correcting the output frequency.

Figure 2:
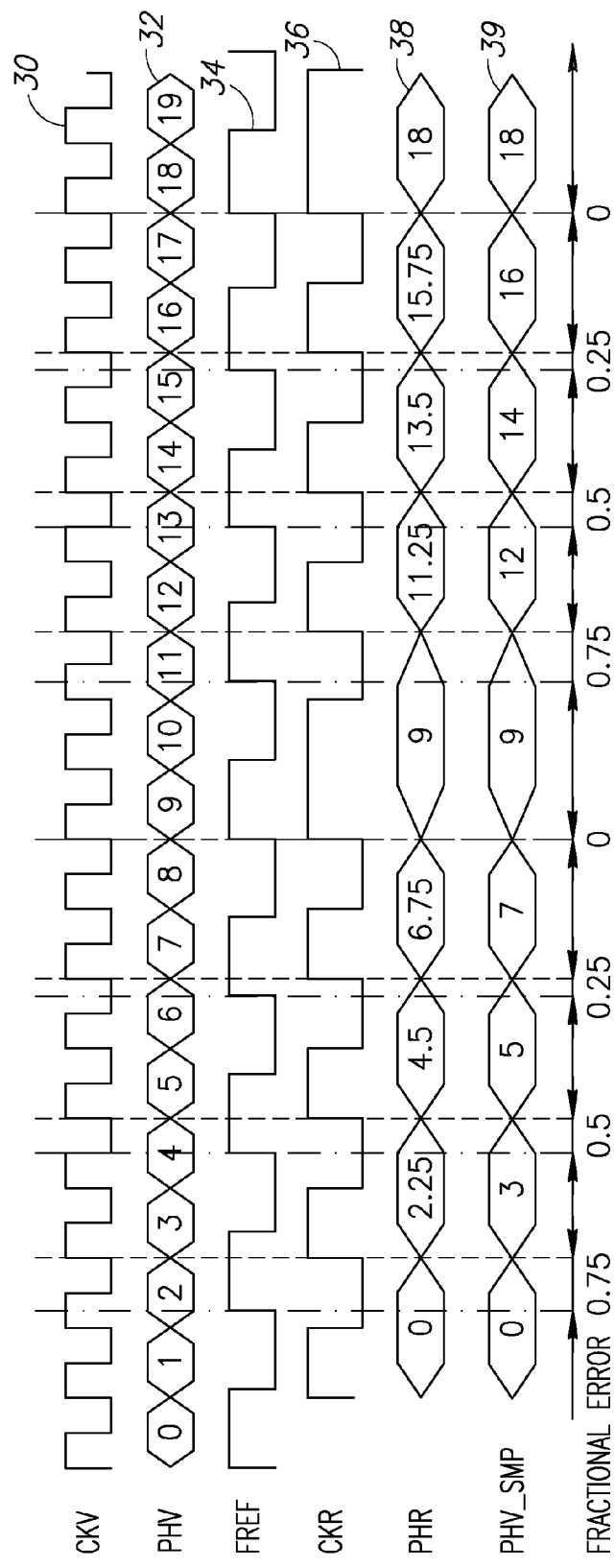
FIG. 2 is a timing diagram illustrating example clock and phase signals in a phase domain ADPLL.

A timing diagram illustrating example clock and phase signals in an accumulator based ADPLL is shown in FIG. 2. The signal waveforms of interest in an accumulator-based ADPLL are shown where FCW is 2.25. The variable phase error PHV is the count of CKV rising edges and is sampled by CKR, which is generated by means of oversampling FREF by CKV. CKR is clocking the reference frequency accumulator that generates the reference phase PHR. From this example it can be seen that if the reference phase PHR and sampled variable phase PHV_SMP are subtracted to generate the phase error there will be a fractional error that is induced due to retiming of the reference clock. The fractional error, normalized to the average variable clock period, can be estimated by passing FREF and CKV through a TDC and which extends the variable phase into a real number. In this manner, the accuracy of the phase error estimation corresponds to the resolution of the TDC, which is in the order of picoseconds in modern CMOS technologies for simple inverter chain topologies.

A closer look at FIG. 2 reveals that the fractional error between the phase signals is deterministic and, in fact, periodic. This means that every reference rising edge can be delayed during operation of the ADPLL using a digital-to-time converter (DTC) to obtain a clock $FREF_{dly}$, so that the $FREF_{dly}$ and CKV clocks are aligned. The advantages of this architecture are summarized below.

First, without reference edge prediction, the TDC must cover at least one $T_V$ range. By using edge prediction, the TDC size can be significantly reduced, only to resolve the timing difference between CKV and $FREF_{dly}$ that exists due to any non-deterministic noise source or finite resolution of the DTC. A much smaller TDC implies a higher linearity, especially when a particular application requires a very high TDC resolution. Since DTC and TDC resolution are not required to be the same, it is easier to construct a linear DTC of coarser resolution than a TDC of a high resolution covering the whole $T_V$ range.

Second, since $FREF_{dly}$ and CKV edges are aligned, there is no metastability problem with FREF retiming. The spacing between the two clocks now becomes constant, i.e. within one DTC resolution value, and no significant complexity and power is needed to avoid metastability.

Third, the delayed version of the reference edge, $FREF_{dly}$ can be also used to gate the CKV clock and generate a clock CLK containing only one pulse to clock the TDC. As such, the TDC can run at the FREF clock rate resulting in significant amount of power savings on the order of $f_R/f_V$ or $1/FCW$.

Fourth, when the loop is in a settled state, the integer part of the phase error, $PHE_I$ is zero, so the variable counter, which operates at the variable rate, can be switched off in order to reduce power consumption.

In order to achieve the $FREF_{dly}$/CKV alignment, the amount of time that the FREF edge has to be delayed on every cycle must be extracted. In a type-II ADPLL, the average value of the phase error is zero, which we can express as the following:

$$\varepsilon\left\{\frac{t_R - t_V}{T_V} - PHR_F\right\} = 0 \quad (2)$$

Where $t_R$ and $t_V$ denote the timestamps of the reference and variable clock, respectively. The first term of Equation 2 is the output of the TDC and since the TDC is used to estimate the fractional part of the reference phase, the statistical average value of those two values are expected to be zero. This is an inherent consequence of a type-II loop, whereas in a type-I loop this difference is expected to be a constant value other than zero.

Equation 2 can be rewritten as the following:

$$\varepsilon\{(t_R - PHR_F * T_V) - t_V\} = 0 \quad (3)$$

From Equation 3 we can deduce that in order to align the two edges, a negative delay equal to $PHR_F * T_V$ is required. This, however, is unachievable in a real causal implementation, because it essentially means that we want to align with the previous variable edge. It is practically possible to align to the following variable edge by adding the value $T_V$ to both sides of Equation 3 as follows:

$$\Sigma\{(t_R + (1-PHR_F) * T_V) - t_V\} = T_V \quad (4)$$

Thus, the reference edge has to be delayed by $$t_{del} = (1-PHR_F) * T_V \quad (5)$$

in order to align with the variable edge. Note that, for a given output frequency, the delay depends only on the fractional part of the reference phase, which is provided by accumulating the fractional part of the frequency command word, $FCW_F$, and that the maximum delay that has to be achieved is equal to the variable period $T_V$. Waveforms of $PHR_F$ (not shown) and the respective delay that FREF has to undergo at each reference cycle have a periodic behavior. Since $PHR_F$ increases by $FCW_F$ per reference cycle, the number of cycles per folding of the waveform is $1/FCW_F$ if $FCW \le 0.5$ and $1/(1-FCW_F)$, if $FCW_F > 0.5$, due to folding. We can group those two results as $1/min(FCW_F, 1-FCW_F)$. Thus, the time that one folding takes is $1/min(FCW_F, 1-FCW_F) * T_R$. Subsequently, the fundamental frequency of the $FCW_F$ waveform and as a result, the delay waveform, is simply the inverse of that and is given by the following:

$$f_{PE} = min(FCW_F, 1-FCW_F) * f_R \quad (6)$$

This means that nonlinearity-caused frequency spurs are expected due to DTC nonlinearity at multiples of this frequency. Additionally, quantization spurs are located at $$f_q = \frac{f_R}{f_V} \frac{\alpha}{\Delta t} \quad (7)$$

for near-integer channels.

To practically achieve the required delay of Equation 5, a digital-to-time converter (DTC) is used. The DTC is the equivalent of a DAC where the analog quantity is time. The TDC is the equivalent of an ADC that digitizes time intervals. If a DTC that is used has a resolution of $\Delta t$, we can define the gain of the DTC as the following:

$$K_{DTC} = \frac{\Delta t}{T_V} \quad (8)$$

and the code that needs to be applied to the DTC at each reference clock is given by $$Code_{DTC} = \frac{1 - PHR_F}{K_{DTC}} \quad (9)$$

The code applied to the DTC specifies the number of minimum achievable delay values by which the reference edge has to be delayed.

Figure 3:
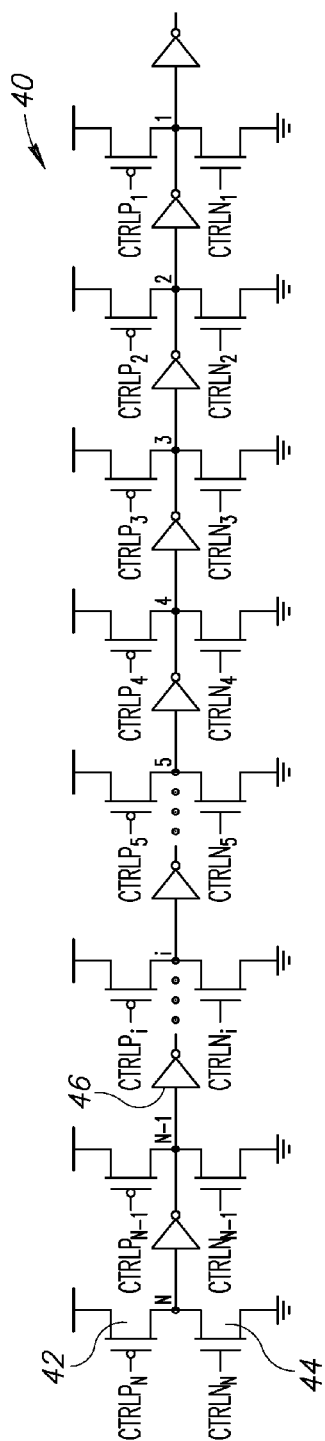
FIG. 3 is a schematic diagram illustrating an example circuit implementation of a digital to time converter (DTC) of the present invention.

A schematic diagram illustrating an example circuit implementation of a digital to time converter (DTC) of the present invention is shown in FIG. 3. The structure, generally referenced 40, comprises a chain of inverter delays 46 whose input node voltage can be set to either logic low or logic high value by a pair of transistors 44, 42, respectively, referred to as set-reset transistors. These transistors are controlled by the signals CTRLPi and CTRLNi for the PMOS and NMOS transistors, respectively. Three scenarios are allowable:

1. CTRLPi is set high and CTRLNi is set low. Then, none of the two transistors that those signals control is on and the node is floating and its voltage is set by the inverter that drives it.
2. CTRLPi is set to low and CTRLNi is set to low. Then, the PMOS transistor is on and forces the node to a logic high.
3. CTRLPi is set to high and CTRLNi is set to high. Then, the NMOS transistor is on and forces the node to a logic low.

Note that turning both transistors on at the same time is a forbidden state because it would create a direct current path from the supply to ground and result in ambiguous voltage setting on the node.

Based on the described operation, the total delay of the delay line can be digitally controlled by setting the control signals CTRLP and CTRLN at each delay element accordingly. In one embodiment, the DTC operates in three distinct phases or states: reset state, set state and propagation state.

In the reset state all the nodes in the delay chain are set such that the output is steadily at a logic low, i.e. every odd node of the chain shown in FIG. 3 is set to high and every even node to low.

In the set state the control code is applied. If k inverter delays are desired, then the voltage level of nodes k to N is inverted and the nodes from 1 to k−1 are set to floating in order to allow for propagation of the disturbance.

In the propagation state, the disturbance created at nodes k to N propagates down the delay line reaching the output after k inverter delays.

Figure 4:
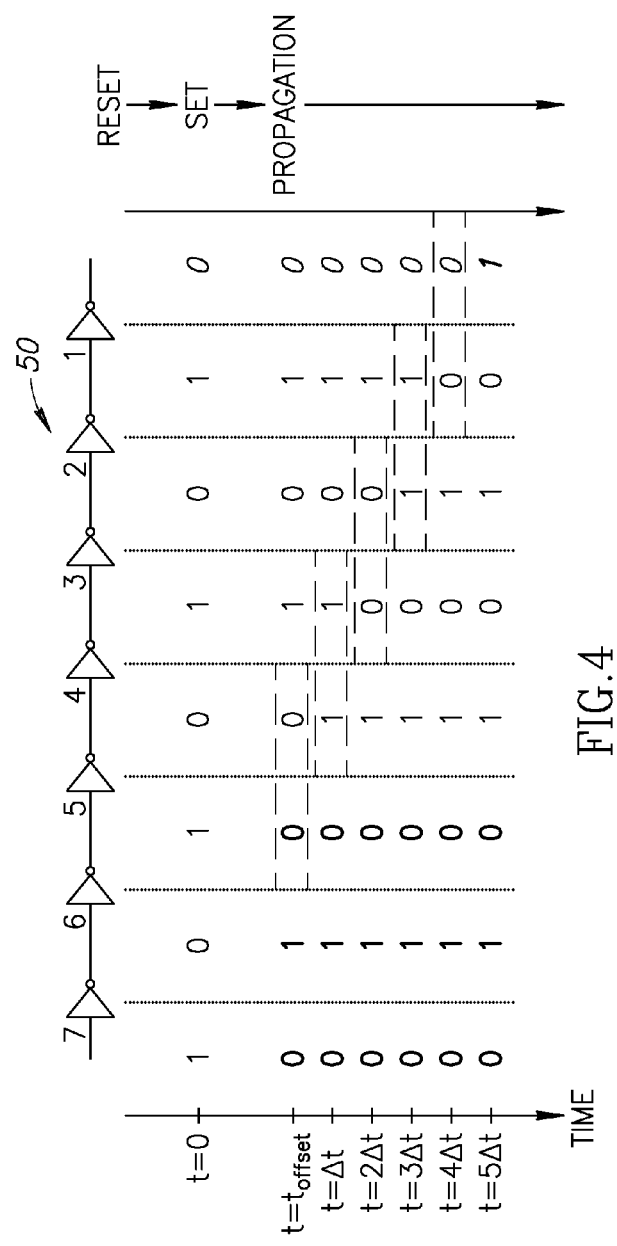
FIG. 4 is a timeline diagram illustrating DTC operation in an example where $Code_{DTC}$ is five.

A timeline diagram illustrating DTC operation in an example where $Code_{DTC}$ is five is shown in FIG. 4. Before the reference pulse arrives, the DTC is in the reset state and the output is zero. When the FREF clock arrives, the DTC chain 50 is set according to the DTC code. Independent of the DTC code, there is always an offset time between the activation of the code and the start of propagation, which is the time that it takes for the nodes to invert. There is an offset between the sizing of the set-reset transistors and the inverters. Increasing the strength of the set-reset transistors reduces the offset time, but creates higher loading for the inverters causing higher inverter delay $\Delta t$. This offset can be tolerated by the ADPLL as long as it remains constant since what is important is the relative alignment between the FREF and CKV edges. The total delay of the DTC is given as $$delay_{DTC} = t_{offset} + Code_{DTC} * \Delta t \quad (10)$$

A truth table for the digital logic that controls the gates of the set-reset transistor gates is shown below in Table 1.

TABLE 1

Truth table for set-reset digital control logic

| $b_{2i}$ | FREF | $CTRLN_{2i}$ | $CTRLP_{2i}$ | 2i |
|---|---|---|---|---|
| 0 | 0 | 1 | 1 | 0 |
| 0 | 1 | 0 | 1 | Z |
| 1 | 0 | 1 | 1 | 0 |
| 1 | 1 | 0 | 0 | 1 |

| $b_{2i+1}$ | FREF | $CTRLN_{2i+1}$ | $CTRLP_{2i+1}$ | 2i + 1 |
|---|---|---|---|---|
| 0 | 0 | 0 | 0 | 1 |
| 0 | 1 | 0 | 1 | Z |
| 1 | 0 | 0 | 0 | 1 |
| 1 | 1 | 1 | 1 | 0 |

The DTC code is applied as thermometer coding shown in Table 2 below for the case of a seven element DTC. This circuitry allows the DTC to be reset when the FREF is low and set to the configuration corresponding to the code when the FREF clock edge arrives.

TABLE 2

Binary to thermometer conversion for the DTC code

| $Code_{DTC}$ | $Code_{DTC, therm}$ |
|---|---|
| 1 | 1111111 |
| 2 | 1111110 |
| 3 | 1111100 |
| 4 | 1111000 |
| 5 | 1110000 |
| 6 | 1100000 |
| 7 | 1000000 |

It can be seen from FIG. 4 that what actually propagates through the delay chain is two consecutive logic states. As such, it is possible to continue this propagation to a TDC and decode its output by the location of two consecutive zeros or ones when the positive CKV clock edge arrives. This location is also referred to as a marker location. It is appreciated that one skilled in the art can readily design a circuit to implement the above described set-reset control logic and related encoding and decoding functions.

The gain of the DTC, $K_{DTC}$ is accurately known if both the desired output frequency $f_V$ and the unit element delay $\Delta t$ are known. Although the former is clearly known as a type-in feature of the ADPLL, the latter is subject to drifting from its simulated value due to PVT variations. As a consequence, on-the-fly estimation of the DTC gain is desirable during operation of the ADPLL. If the $K_{DTC}$ value is accurate then the reference and variable edges will be aligned and the rms value of the phase error corresponds to that of the TDC and reference clock phase noise. A $K_{DTC}$ estimation error introduces an additional rms value on the phase error because the predicted reference edge delay per cycle changes faster (i.e. $K_{DTC}$ underestimated) or slower (i.e. $K_{DTC}$ overestimated) than it should. This discrepancy from the ideal delay is captured by the TDC and is expressed as a quantized phase error that passes through the loop filter resulting in increased in-band phase noise. Because the fundamental frequency of this error is equal to $f_{PE}$ (from Equation 6), the phase noise deterioration is worse in near-integer channels where $f_{PE}$ falls well within the loop bandwidth.

Note that assuming $K_{DTC}$ underestimation under a locked ADPLL state, the DTC code will consistently be larger than the ideal one, as Equation 9 shows, causing the reference phase to move faster than the CKV phase, or the ideally predicted FREF phase. The difference between the ideal phase and the predicted phase is expressed as the phase error and the points where the two waveforms intersect correspond to $PHR_F = 0.5$. As a result, a correlation can be established for the underestimation case as follows $$(PHR_F - 0.5) \cdot PHE_F < 0 \quad (11)$$

and, correspondingly, for the overestimation case $$(PHR_F - 0.5) \cdot PHE_F > 0 \quad (12)$$

A digital implementation of this architecture (not shown) generates a term to correct the initial guess of $K_{DTC}$ by essentially evaluating a term proportional to $(PHR_F - 0.5) \cdot sign(PHE_F)$ and applying IIR filtering to it. $\hat{K}_{DTC}$ denotes the estimated value of $K_{DTC}$. The proportionality factors $2^{-b}$, $2^{-\mu}$ and the IIR filter parameter $2^{-\alpha}$ are powers of two for easier implementation using left shifts just as in the loop filter case. The parameters can be adjusted for fast settling and accuracy of the final $\hat{K}_{DTC}$ value.

If the DTC and TDC are implemented using matched unit delays, only one DTC-TDC gain estimation loop needs to operate and the two gains are equal. If the resolution of the DTC and TDC circuits is not the same but the delays are still matched so that $\Delta t_{DTC}=\kappa\Delta t_{TDC}$ then the gain of the TDC ($K_{TDC}$) can be calculated using the estimated gain of the DTC ($K_{DTC}$) by using $K_{TDC}=K_{DTC}/\kappa$. In a practical case, however, it is quite difficult to ensure a uniform value of $\kappa$ over PVT variations if the inverter delay units or cells of the TDC and DTC have different sizing and loading.

A special set of channels where this estimation method is not applicable is the integer-N channels. In this case, a correlation between $PHR_F$ and $PHE_F$ does not exist, since $PHR_F$ is always zero. Integer-N channels, however, do not require $K_{DTC}$ estimation since any initial residual error can only be expressed as an average value (i.e. the DTC code is constant) that will soon be forced to zero by the loop, as long as the loop is type-II and the in-band phase noise is not affected. If the $K_{TDC}$ and $K_{DTC}$ estimation are tied together, as suggested in the previous paragraph, $K_{TDC}$ is multiplied by the TDC output value in order to generate $PHE_F$. The ratio $\hat{K}_{DTC}/K_{TDC}$ can be incorporated to the proportional factor $\alpha$ of the loop filter causing an effective proportional factor $\alpha'\ne\alpha$. As such, an error in $K_{DTC}$ estimation implies an error in the proportional loop parameter, which affects the bandwidth and dynamic performance of the ADPLL. This effect, however, is much less serious than the increase of in-band phase noise floor and can be acceptable if $\hat{K}_{DTC}$ does not differ beyond reasonable values, e.g., $0.7\cdot K_{TDC}<\hat{K}_{DTC}<1.3\cdot K_{TDC}$, which is achievable based on practical PVT variations of $\Delta t$ in modern CMOS processes.

Figure 5A:
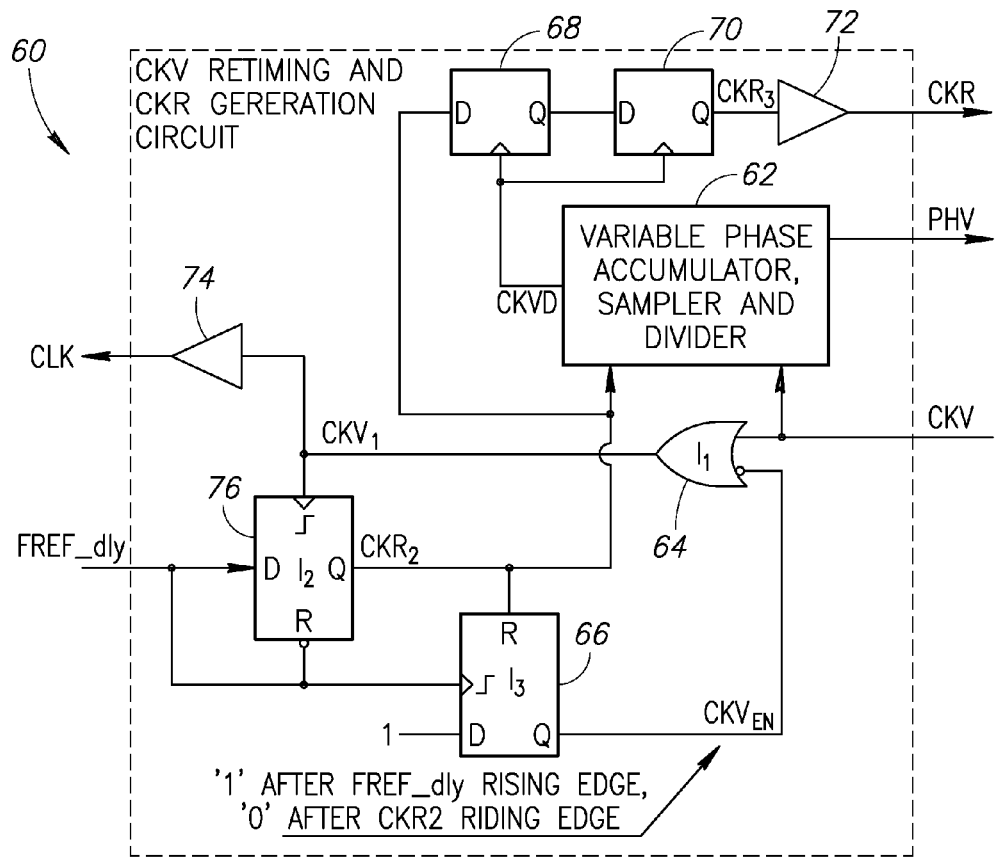
FIG. 5A is a logic diagram illustrating an example CKV retiming and CKR generation circuit.
Figure 5B:
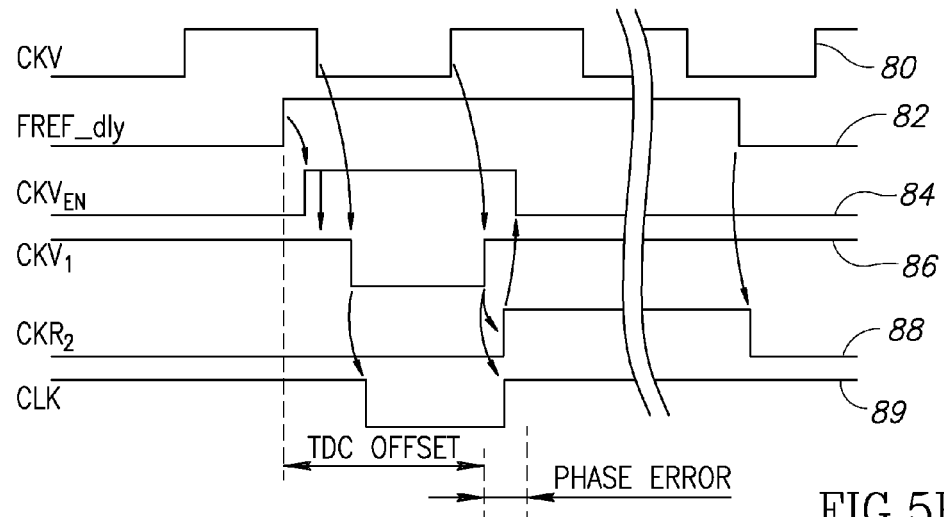
FIG. 5B is a timing diagram illustrating the signal waveforms related to the circuit of FIG. 5A.

A digital circuit is used to implement the CKV gating and metastability-free reference retiming that derives from the ADPLL architecture. A logic diagram illustrating an example CKV retiming and CKR generation circuit is shown in FIG. 5A. A timing diagram illustrating the signal waveforms related to the circuit of FIG. 5A is shown in FIG. 5B. The TDC clock gating portion of the circuit, generally referenced 60, comprises two asynchronously resettable flip-flop registers or latches 66, 76 and one OR gate 64. We assume that $FREF_{dly}$ and CKV have a certain separation that is properly designed. The operation of this circuit is described as follows.

When FREF_dly (trace 82) is zero, $CKR_2$ is asynchronously set to zero by $I_2$. FREF_dly rising edge sets $CKV_{EN}$ (trace 84) to one through $I_3$. CKR remains zero because $CKV_1$ (trace 86) has not transitioned yet. $CKV_1$ is CKV only when $CKV_{EN}$ is one by means of gate $I_1$. $CKV_1$ is buffered and used to sample the TDC output. $CKV_1$ is used to latch FREF_dly and $CKR_2$ (trace 88) becomes one. Consequently, it resets flip-flop $I_3$ so that $CKV_{EN}$. As such, no other CKV pulse passes through CLK (trace 89) because the first CKV pulse sets $CKV_{EN}$ to zero. $CKR_2$ is resampled by a divided version of $CKV_{EN}$ and generates the CKR clock for the digital logic. $CKR_2$ is also used to sample the variable counter output.

It is noted that prior art accumulator-based ADPLL implementations tend to consume a considerable amount of power, since the TDC has to cover at least one variable clock period ($T_V$). As an example, if the minimum variable clock frequency is 1 GHz then the TDC has to cover 1000 ps, which corresponds to 100 inverters at the fastest delay of 10 ps. Post-layout simulations performed by the inventors indicate that at the maximum frequency end of 2 GHz, a 100-inverter TDC chain consumes 10 mW at 2 GHz, which may make up the entire ADPLL power budget. One solution is to employ clock gating of the variable clock at the TDC. This solution, however, fails to provide optimal circuitry that allows only the single necessary clock edge to pass to the TDC.

In order to reduce power consumption of the ADPLL, the deterministic nature of the phase error during the frequency/phase lock is taken advantage of to modify the ADPLL architecture. For every reference clock cycle, assuming locked type-II loop (i.e. both frequency and phase lock), the deterministic time difference between the reference clock (FREF) rising edge and the feedback clock (CKV) next rising edge is given by:

$$\Delta t=(1-PHR_F)\cdot T_V \quad (13)$$

where $PHR_F$ is the fractional part of the accumulated frequency command word $FCW=T_R/T_V$, where $T_R$ is the period of FREF. In other words, FCW is the targeted ADPLL frequency multiplication ratio. Equation 13 suggests that each FREF rising edge can be delayed by a deterministic amount of time so that a delayed version of FREF is created, namely $FREF_{dly}$, which is aligned (to within a small constant offset) to the next rising edge of CKV. This predictive effect is called the look-ahead action.

The advantages of implementing the look-ahead architecture are numerous. First, the delay operation occurs at the FREF rate, which is typically two orders of magnitude lower than the CKV rate. It is noted that, even when proper prediction occurs, there is always a non-deterministic component of the FREF-to-CKV delay that renders the use of a TDC to resolve the $FREF_{dly}$-to-CKV residual delay necessary. Nevertheless, the TDC action is carried out by only a few delay elements. Most importantly, since $FREF_{dly}$ and CKV are now aligned, $FREF_{dly}$ can be used to clock gate the TDC, allowing its operation at FREF rate.

Another key benefit of the look-ahead action is that retiming the FREF to create a digital clock (CKR) for the feedback loop is now a metastability free operation and therefore no significant circuit-level effort and power consumption are required to resolve it. Instead, a conventional re-sampling of $FREF_{dly}$ by a divided version of CKV is sufficient as the CKR generation mechanism.

Figure 6:
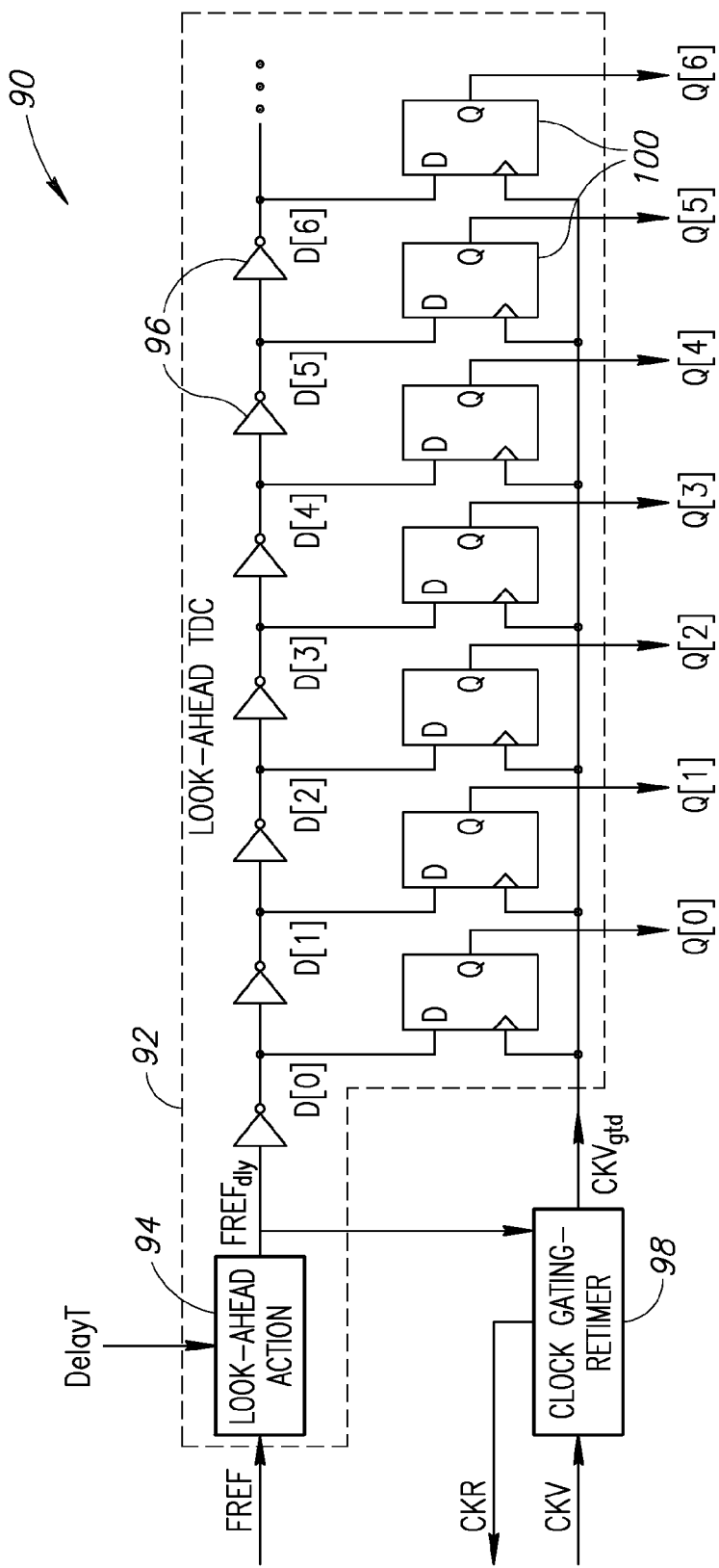
FIG. 6 is a block diagram illustrating an example look-ahead time to digital converter (TDC) with interconnection to clock gating and retiming circuitry.
Figure 7:
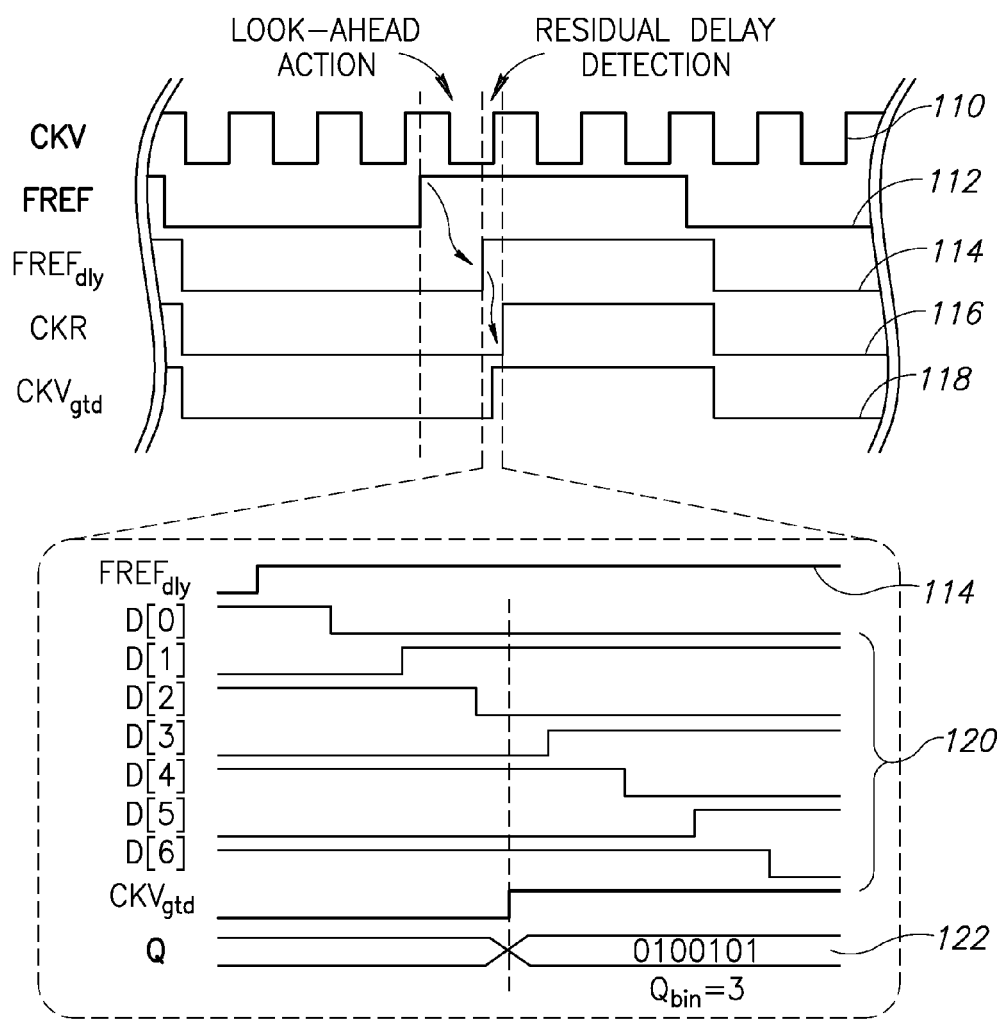
FIG. 7 is a timing diagram illustrating the signal waveforms related to the circuit of FIG. 6.

A block diagram illustrating an example look-ahead time to digital converter (TDC) with interconnection to clock gating and retiming circuitry is shown in FIG. 6. A timing diagram illustrating the signal waveforms associated with the look-ahead action is shown in FIG. 7. The circuit, generally referenced 90, comprises a look-ahead TDC 92 and clock gating-retimer circuit block 98. The look-ahead TDC 92 comprises a look-ahead circuit block 94, plurality of inverter delays 96 and corresponding D flip-flops or latches 100.

In operation, the FREF clock signal is delayed within the look-ahead TDC to generate $FREF_{dly}$, which is then used to generate CKR and a clock-gated version of the CKV, called $CKV_{gtd}$. CKR is used as a digital global clock, while $CKV_{gtd}$ (at FREF rate) samples the TDC instead of the high-rate CKV to resolve the residual error between $FREF_{dly}$ and CKV. Unlike TDCs in prior art ADPLL implementations, where the CKV clock is propagated through the inverter chain and sampled by FREF, in this embodiment it is much more convenient to propagate $FREF_{dly}$ instead and sample it with a gated version of CKV, both at a slow rate.

It can be seen from the example of FIG. 6 that the output of the flip-flops 100 can be converted to an integer number by identifying the location of two consecutive identical logic values in the output bit stream. This integer number can be normalized to yield a representation of the fractional part of the phase error between FREF and CKV ($PHE_F$) when the ADPLL is locked. In the example circuit of FIG. 6 and associated example waveforms of FIGS. 7, D[0] to D[6] (traces 120) are latched by the flip-flops where the disturbance manifests as two consecutive zeros (D[2] and D[3]). The decoded output Q (trace 122) of the delay is three, which corresponds to a delay of three inverters (3·$t_{inv}$).

Figure 8A:
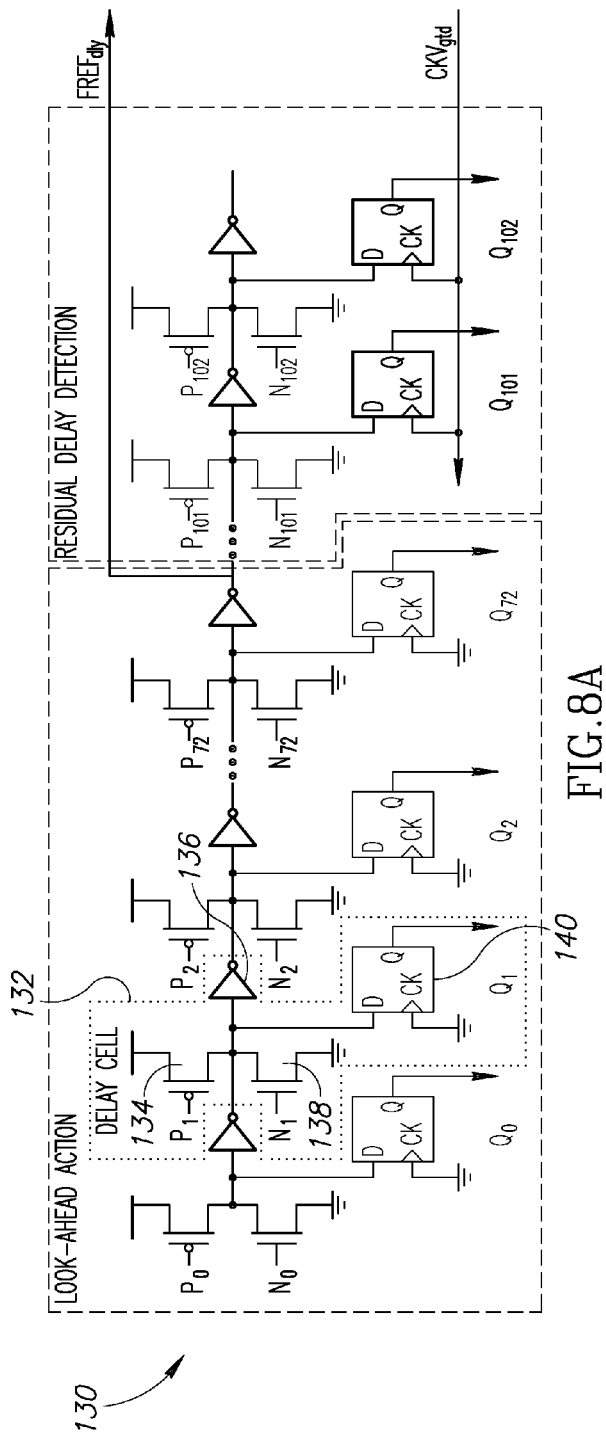
FIG. 8A is a block diagram illustrating an example look-ahead TDC circuit implemented with identical controllable delay elements (or cells)
Figure 8B:
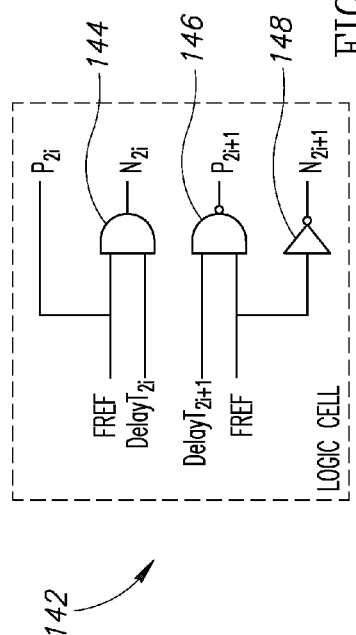
FIG. 8B is a block diagram illustrating an example logic cell of the circuit of FIG. 8A in more detail.

A block diagram illustrating an example look-ahead TDC circuit implemented with identical controllable delay elements (or cells) is shown in FIG. 8A. A block diagram illustrating an example logic cell of the circuit of FIG. 8A in more detail is shown in FIG. 8B. The look-ahead TDC, generally referenced 130, is implemented as a sequential chain of identical controllable delay elements 132 (i.e. cells) that can be used either as delay elements for the look-ahead action or as sampling elements for resolving the FREF$_{dly}$-to-CKV time delay. Each delay cell 132 comprises an inverter 136 and a pair of set/reset transistors 134, 138 that can pull up or down the corresponding cell input node, respectively. In addition, a compact D flip-flop (DFF) 140 optimized in one embodiment for minimum input capacitance and small setup and hold times is placed at each intermediate node. The simulated typical delay of the generic cell is 15 ps while the differential nonlinearity (DNL) and integral nonlinearity (INL) values are 0.5 LSB and 1 LSB, respectively.

In one embodiment, the cells located in the beginning of the inverter chain perform the look-ahead action, effectively acting as a digital-to-time converter (DTC). In this case, the DFFs function only as dummy loads (i.e. the four DFFs starting from the left side of the chain in FIG. 8A) while the corresponding set-reset transistors are active. The intended functionality of the DTC portion of the chain is the propagation of a single disturbance pulse through a desired number of inverter delays. Since the FREF$_{dly}$ output is fixed, the FREF input is dynamically selected every reference cycle via the control of the set/reset transistors. A logic control cell, shown in FIG. 8B, converts a thermometer-coded input into the control signals for the pMOS and the nMOS transistors, respectively.

Figure 9A:
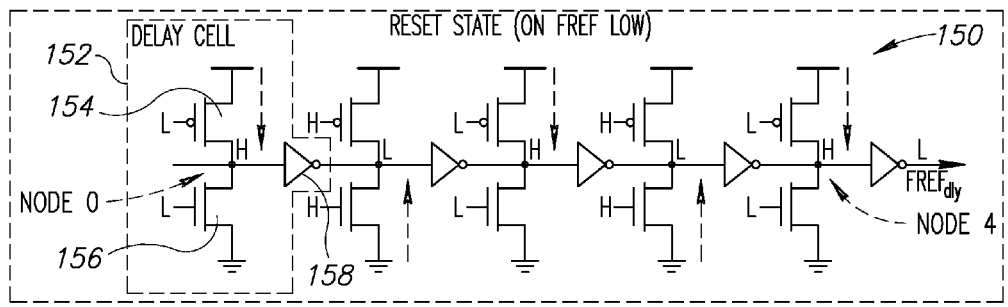
FIGS. 9A, 9B and 9C are block diagrams illustrating transition of the look-ahead portion of the TDC through the reset, set and propagation states, respectively, for the generation of a delay of two inverter delays.
Figure 9B:
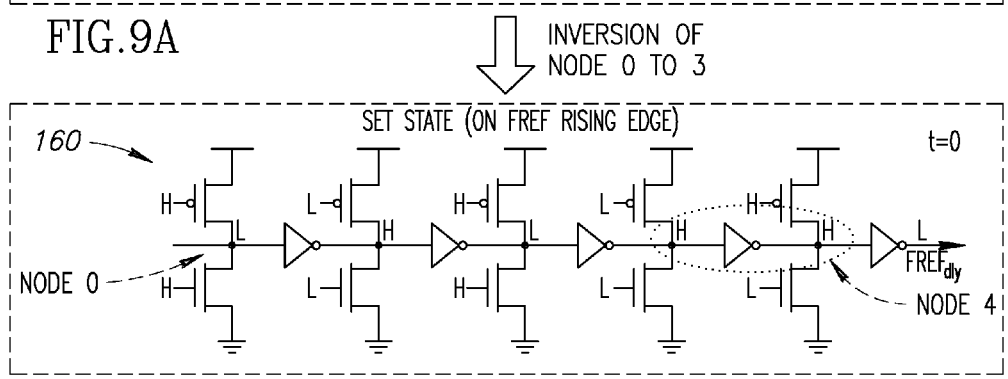
Figure 9C:
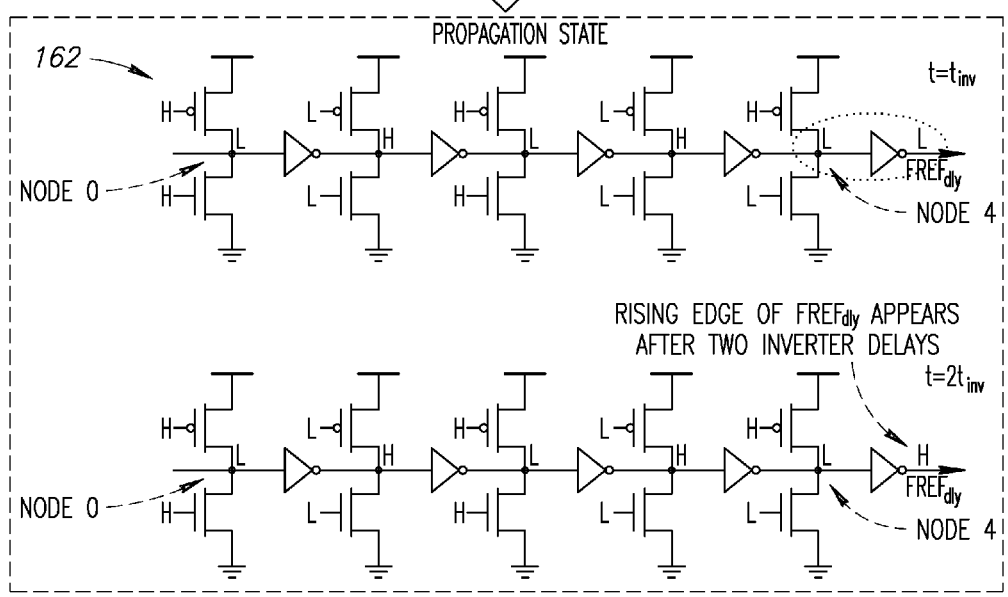

An example of the look-ahead action of the TDC will now be described. Block diagrams illustrating transition of the look-ahead portion of the TDC through the reset, set and propagation states for the generation of a delay of two inverter delays is illustrated in FIGS. 9A, 9B and 9C, respectively. It is appreciated that the operating principle of the look-ahead action can be extended, without loss of generality, over any multiple of the inverter delays ($t_{inv}$).

With reference to FIG. 9, the look-ahead TDC goes through three distinct and consecutive states during every FREF cycle: the reset state, the set state and the propagation state. With reference to block 150, the reset state occurs when FREF is low and sets the output FREF$_{dly}$ to a steady low state. Therefore, each even-numbered node is set to high and each odd-numbered node to low by turning on the pMOS or the nMOS transistor, respectively.

With reference to block 160, in the set state, upon a rising FREF edge, a disturbance is generated at the node from which the propagation of the pulse has to start. In this example, the pulse disturbance starts from node 3, two inverters away from the output. To achieve this, all nodes from node 3 backwards are inverted through the set-reset transistors, while the rest of the nodes, up to the end of the delay line, are set as floating by turning their corresponding set-reset transistors off. The disturbance manifests itself as two consecutive identical logic states (either two zeros or two ones), i.e. at the input and output of the same inverter.

With reference to block 162, as a result, during the propagation state, the disturbance is propagated through the rest of the delay line and eventually reaches the residual detection section so that the time difference between FREF$_{dly}$ to CKV can be resolved. At the same time, the FREF$_{dly}$ is used (1) to clock-gate the CKV and (2) for generation of CKR.

The number of cells that the disturbance has to propagate through at each FREF cycle can be calculated by knowing the delay tiny of the cells. Defining the gain of the look-ahead TDC as $K_{TDC} \triangleq t_{inv}/T_V$ and combining it with Equation 13, we obtain the following:

$$delay_{NR} = \frac{1 - PHR_F}{K_{TDC}} \qquad (14)$$

A pseudo-thermometer coding of delay$_{NR}$ as the number of most significant zeros in a bit stream of ones is applied as a signal delayT$_n$ at each logic cell as shown in FIGS. 8A and 8B. Each logic cell functions to convert the delayT$_n$ and FREF signals into the appropriate controls applied to the set-reset transistors. Based on the example of operation of FIG. 7, we can construct a truth table for each signal $P_k$ and $N_k$ and deduct logic functions as in FIG. 8A/B.

It is noted that, apart from the controllable delay, there is a certain offset delay that is associated with the inversion of the nodes during the set state. Because all the nodes are inverted simultaneously, the offset delay can be considered constant, to a first-order approximation, irrespective of the number of the nodes that are inverted. As long as the offset remains constant, it plays no role in the alignment of the clocks.

As mentioned above and highlighted in FIG. 7, the FREF signal is propagated through the chain of inverters while the CKV$_{gtd}$ samples the intermediate node values by means of the DFFs. The flip-flop vector output is decoded as the location of a doublet of high or low logical values and is then normalized to K$_{TDC}$ to yield a representation of the fractional part of the FREF-to-CKV phase error (PHE$_F$).

Figure 10:
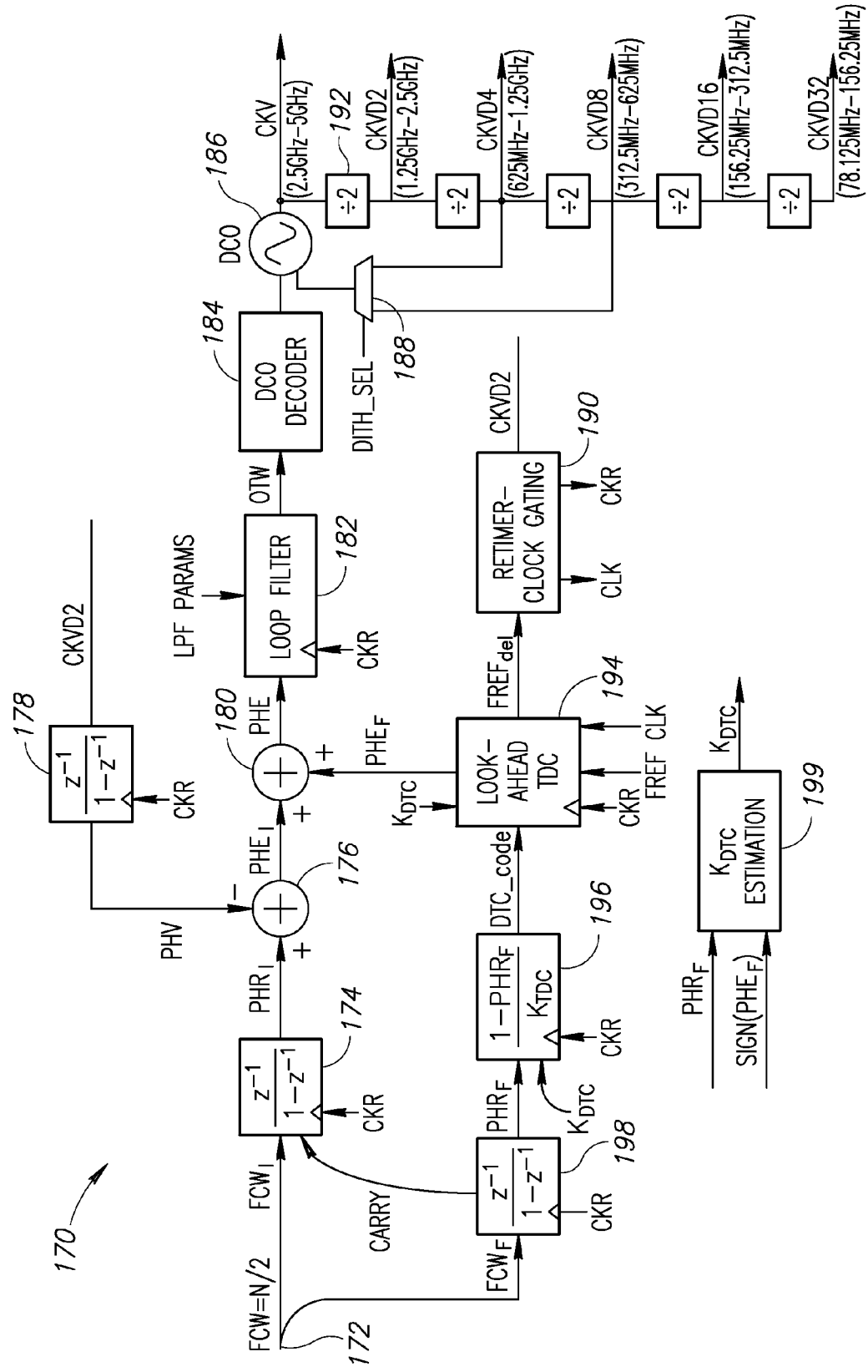
FIG. 10 is a block diagram illustrating an example all digital phase locked loop (ADPLL) incorporating the DTC-TDC pair circuit of the present invention.

A block diagram illustrating an example all digital phase locked loop (ADPLL) incorporating the DTC-TDC pair circuit of the present invention is shown in FIG. 10. The frequency command word (FCW) 172 is split into its integer FCW$_I$ and fractional FCW$_F$ parts, with separate reference accumulators 174, 198 that generate the integer and fractional part of the reference phase, PHR$_I$ and PHR$_F$, respectively. In order to properly accumulate the FCW as a whole, a carry is transferred to the integer accumulator 174 whenever an overflow of the fractional part occurs. In one embodiment, a synchronous 8-bit counter serves as the variable accumulator and produces the variable phase PHV, which is subtracted from PHR$_I$ to provide the integer part of the phase error PHE$_I$. PHR$_F$ is used to calculate the TDC delay code, which is then applied to the look-ahead TDC 194, through a gain. A TDC gain estimation block 199, based on a well-known iterative adaptation algorithm, is implemented (e.g., on chip) to dynamically track delay estimation errors due to PVT variations. The digitized output of the TDC represents the fractional part of the phase error PHE$_F$ that is combined with PHE$_I$ to yield the total fixed-point representation of the phase error PHE.

The phase error PHE is filtered via loop filter 182, in order to properly set the dynamics of the loop. A reconfigurable proportional-integral controller is followed by a DCO decoder 184 to form the oscillator tuning word (OTW). In one embodiment, the DCO comprises the DCO described in U.S. application Ser. No. 14/831,091, entitled "Split Transformer Based LC-Tank Oscillator," filed Aug. 20, 2015, incorporated herein by reference in its entirety. In this DCO, switched capacitor banks are dithered using a $2^{nd}$-order MASH ΣΔ modulator in order to achieve a lower equivalent frequency resolution and push the quantization noise at higher offset frequencies where they are more easily filtered out and do not contribute significantly to the total jitter. The operation frequency of the ΣΔ modulators can be dynamically selected between different divider versions of the oscillator output in order to meet the required performance as a trade-off between power consumption and jitter.

In the example embodiment described herein, the feedback path was chosen to operate at a maximum 2.5 GHz, which means that a divide-by-eight version of the transformer-based DCO output is fed back to the variable accumulator and the look-ahead TDC. Division by eight in the transformer-based ADPLL is achieved by a CMOS digital divider part of which is inside DCO 186.

As described supra, the retimer-clock gating circuit 190 generates the clock signals for the ADPLL. The CKR clock is used as a global digital clock of the ADPLL loop (at the reference clock rate) to resample the output of the variable accumulator and to generate a gated version of the variable feedback clock $CKV_{gtd}$.

Due to its single-ended nature and the fact that it uses both states of the inverters, the DTC structure of FIG. 3 can exhibit a significant amount of rise-fall mismatch, which can be alleviated, in one embodiment, by combining two inverters as one delay element at the expense of making the resolution worse by a factor of two. Nevertheless, random mismatch between the inverters will always exist. Mismatch will create increased spurs at the frequency described by Equation 6 that are particularly troublesome as the fractional ratio of CKV/FREF approaches zero. In a low power design the oscillator is expected to have a worse phase noise performance, which dictates a wide loop bandwidth. In that case, TDC frequency spurs become more difficult to filter out especially because a sharp, low-bandwidth IIR filter is not an ideal solution as it would introduce peaking and stability problems to the loop.

In addition, certain applications, mainly related to wireless communication, cannot tolerate increased fractional spurs as they might increase the integrated phase noise further beyond an acceptable limit. In one embodiment, the reduction of the mismatch-related spurs in delay line TDCs for ADPLLs is achieved by characterizing the TDC nonlinearity and the correction using a look-up table (LUT). In another embodiment, ring oscillator based TDCs can be used that are either mismatch-insensitive by structure or that reduce the mismatch effect by the first-order noise shaping.

In another embodiment of the present invention, a cyclic DTC-TDC circuit pair is used to reduce nonlinearity induced fractional spurs, employing dynamic element matching of the circuit structure by random rotation. An advantage of this solution is that the hardware overhead includes only a linear feedback shift register (LFSR) or other (pseudo) random number generation logic, combinational encoding and decoding logic as well as delayed reference selection logic, as described in more detail infra. It is noted that knowledge of the actual mismatch between the unit delay element cells is not required which avoids the need for complex characterization and the power and hardware overhead of a LUT. This preserves the low power advantages of the ADPLL architecture. Moreover, compared to ring oscillator (RO) based TDCs, the ADPLL incorporating the DTC-TDC circuit pair of the present invention provides more headroom for low power operation at the same performance level due to true reference rate operation without requiring complex circuitry for calibration and variable clock gating.

Figure 11:
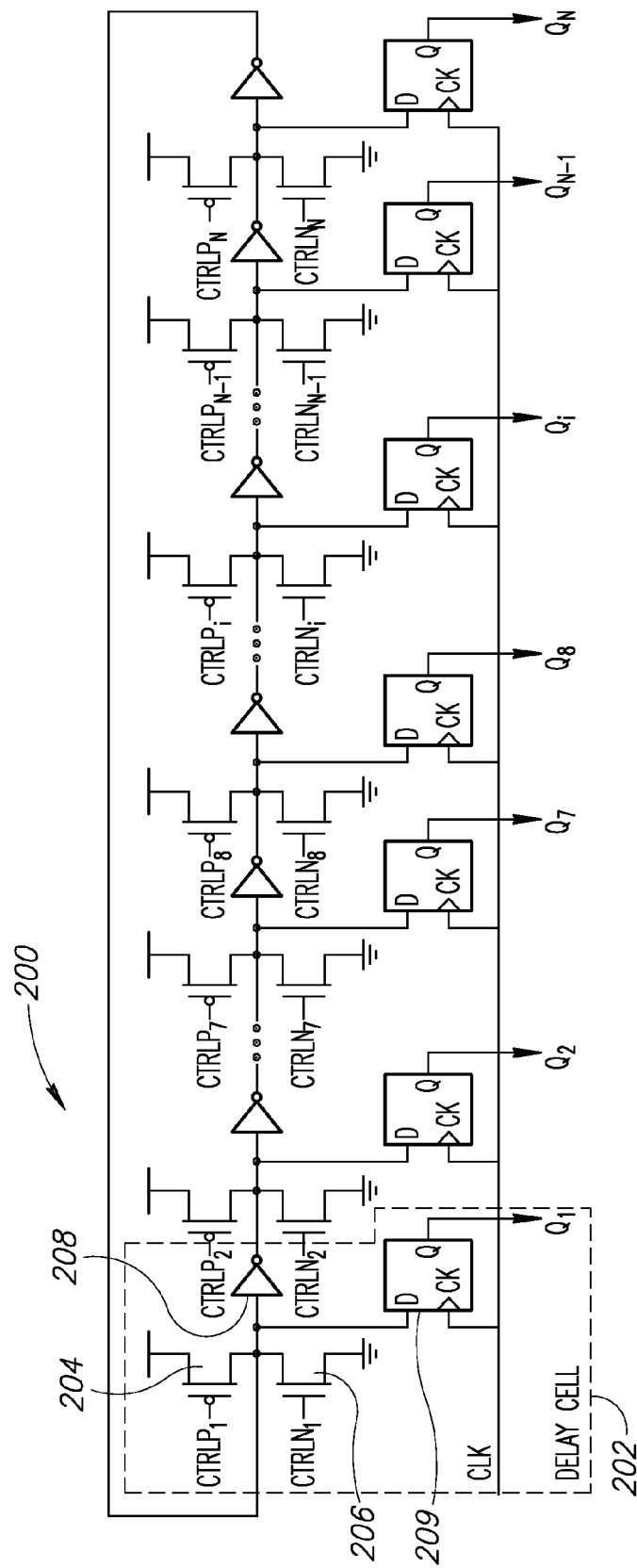
FIG. 11 is a schematic diagram illustrating an example cyclic DTC-TDC pair circuit of the present invention.

A block diagram illustrating an example look-ahead time to digital converter (TDC) with interconnection to clock gating and retiming circuitry is shown in FIG. 11. The circuit generally referenced 200, comprises a plurality of unit inverter delay elements (or cells) 202 that can be used either as part of the DTC or TDC circuit. This circuit is similar to that of the DTC schematic of FIG. 3 with sampling flip-flops or latches 209 added. Each inverter delay element comprises pull up transistor 204, pull down transistor 206, inverter 208 and D flip-flop (DFF) 209.

In addition, the output of the chain has been connected to the input so that the structure becomes cyclic. Because the input of the DTC is only denoted by the thermometer code applied to the set-reset transistors, it is possible to randomly pick any element to be the start of the DTC. Consequently, a number of subsequent elements can be used as DTC and a number (one or more) of elements following those as TDC. Note that any number (one or more) elements may be used as the DTC and any number (one or more) elements may be used as the TDC. In addition, all or a portion of the remaining elements following those used as the DTC may be used for the TDC. With the appropriate encoding and decoding circuits, this configuration enables random rotation of the structure so that the mismatch error per DTC code averages out to zero. In the frequency domain, this causes the spurs to scramble into white noise that can be hidden under the in-band phase noise level of the frequency synthesizer the ADPLL is incorporated into. The random rotation causes the DTC to operate essentially as a mismatch-scrambling dynamic element matching (DEM) digital to analog converter (DAC). Moreover, using the same cells for both DTC and TDC results in matched DTC and TDC gains and requires only one gain estimation for the structure.

Figure 12:
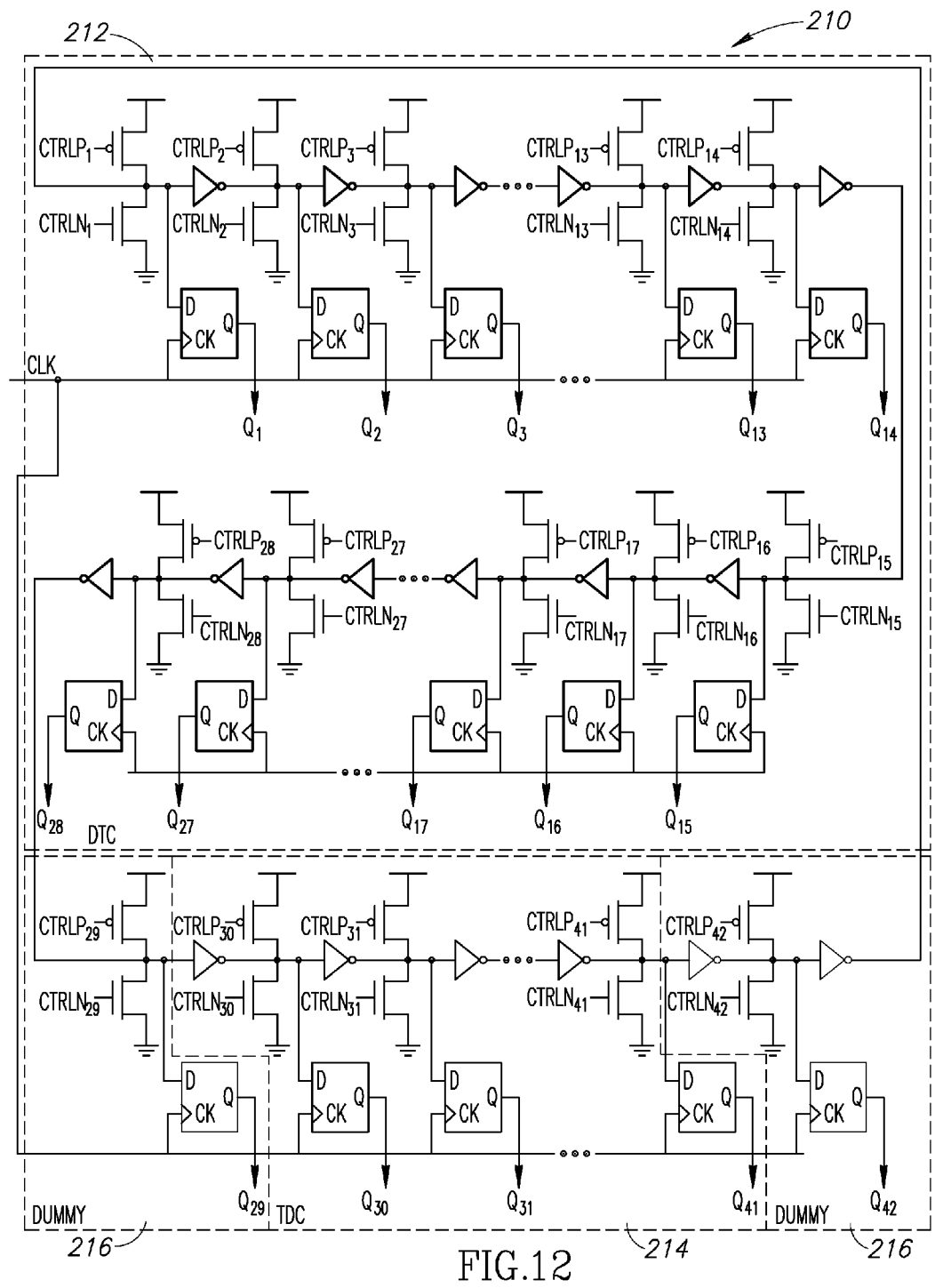
FIG. 12 is a block diagram illustrating an example of a cyclic DTC-TDC pair circuit where 28 elements are used as DTC and 12 elements as TDC.

A block diagram illustrating an example of a cyclic DTC-TDC pair circuit where 28 elements are used as DTC and 12 elements as TDC is shown in FIG. 12. The circuit, generally referenced 210, comprises a delay element chain divided into a DTC portion 212, TDC portion 214 and a dummy portion 216. A common clock CLK is used to clock all the DFFs at the same time.

Figure 13A:
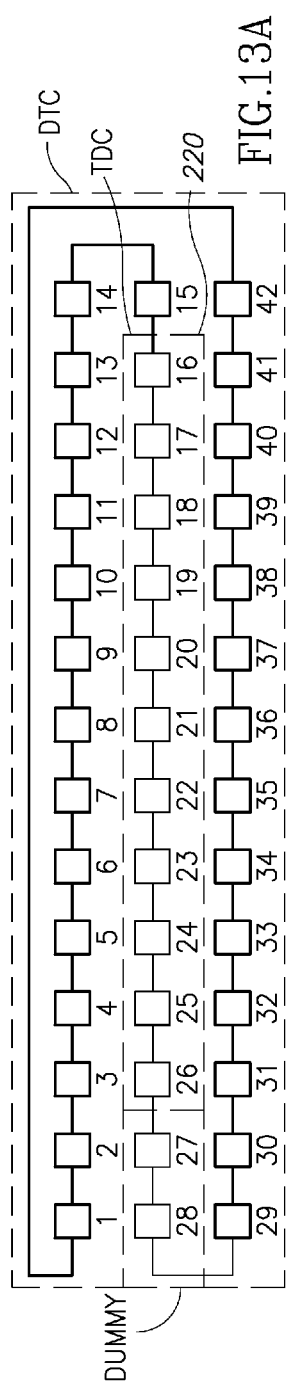
FIGS. 13A, 13B and 13C are block diagrams illustrating examples of cyclic DTC-TDC structure rotation.
Figure 13B:
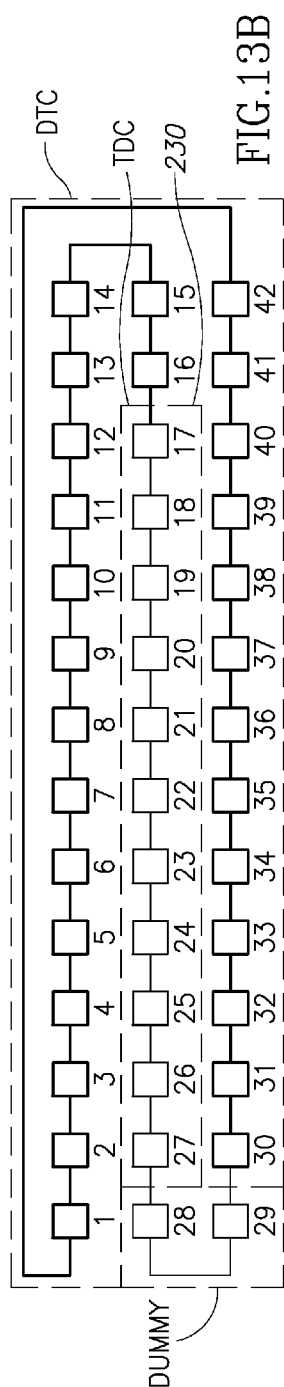
Figure 13C:
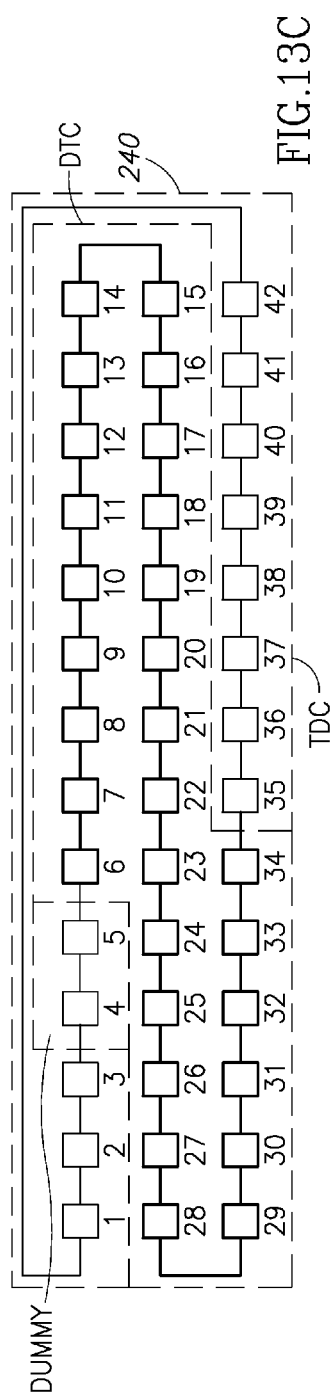

Snapshots of a cyclic DTC-TDC structure are shown in FIGS. 13A, 13B and 13C for indexes of 15, 16 and 34, respectively. If the number of DTC and TDC elements is set, the rotation can be implemented with the aid of an index that denotes a certain element in the structure. In the examples of FIGS. 13A, 13B and 13C, and the RTL implementation that has been implemented for simulations, the index specifies the last element of the DTC. The index is the output of a random or pseudo-random number generator such as an LFSR, as long as the output approximates white noise in the frequency domain.

Consider, however, that the possibility of using $FREF_{dly}$ for TDC gating and FREF retiming may be lost in the cyclic DTC-TDC because the output of the DTC is different at every reference cycle and any element output can be the DTC output. In a typical practical implementation, however, the DTC-TDC structure comprises tens of elements. Implementing a selection of the corresponding DTC output from all the possible outputs would (1) introduce a large amount of delay, (2) excessively load the cyclic DTC-TDC, and (3) increase the overall power consumption.

What is actually required for proper operation of this architecture, however, is not the exact DTC output but a metastability-free rising edge of an FREF-rate clock that samples the next rising edge of CKV. If the retiming circuit has a certain metastability window, there will always be a certain number of signals within the DTC-TDC that can be used as the delayed version of FREF instead of the actual $FREF_{dly}$, namely, one of the previous inverter outputs. The number of inverters behind the edge depends on the specific hold requirement of the retimer/clock gating circuit.

Figure 14:
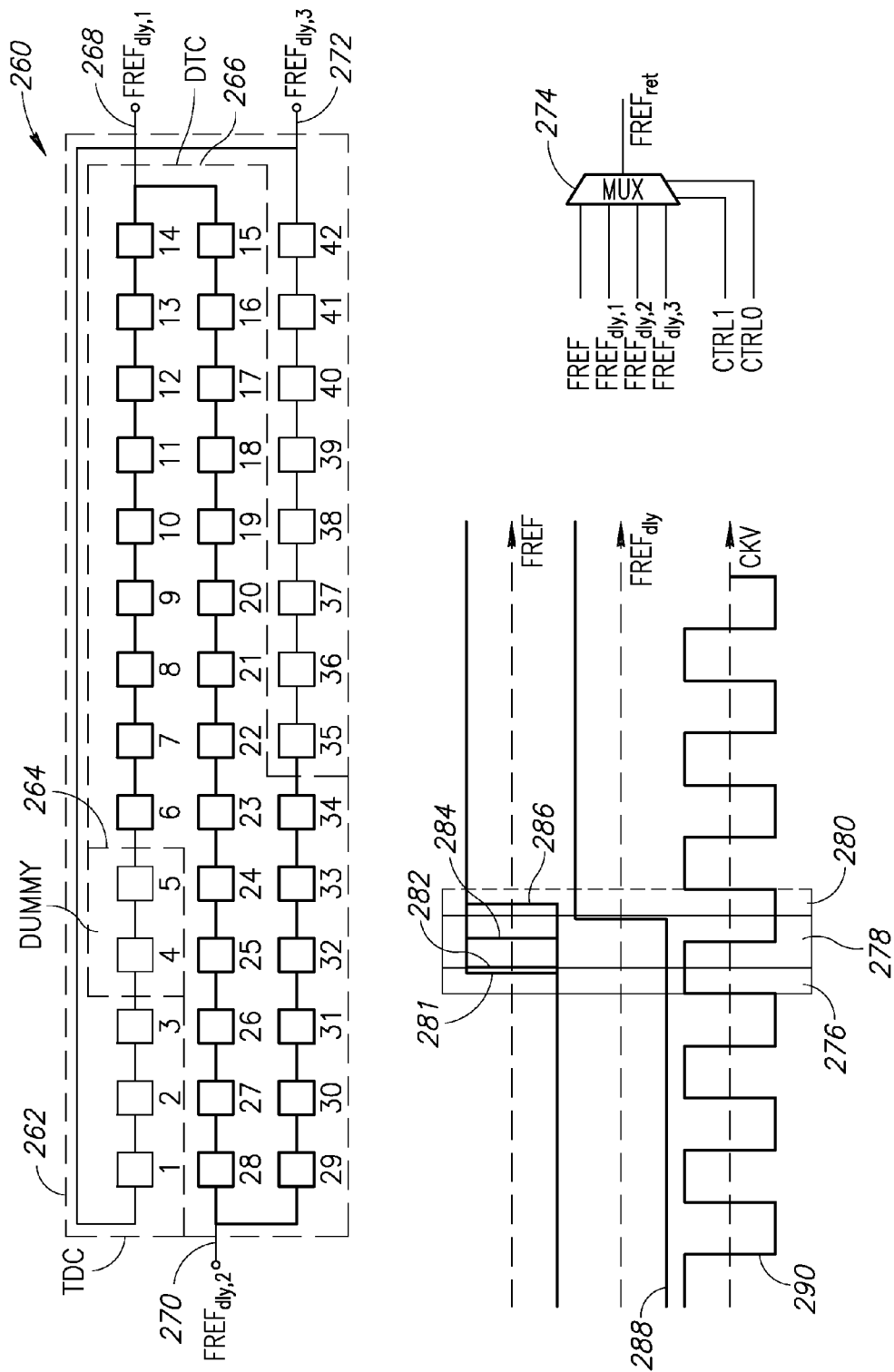
FIG. 14 is a block diagram illustrating enabling FREF retiming and CKV gating using cyclic DTC-TDC structure with three available $FREF_{dly}$ versions.

A block diagram illustrating enabling FREF retiming and CKV gating using cyclic DTC-TDC structure with three available $FREF_{dly}$ versions is shown in FIG. 14. As an arithmetic example, with reference to FIG. 14, we assume that a 2.5 GHz maximum output is targeted which corresponds to a 400 ps CKV period and that the DTC-TDC resolution is 15 ps. If the separation between the CKV and FREF needs to be 100 ps for avoiding a setup violation and the hold violation is 50 ps, then a safe region for the $FREF_{dly}$ edge is (400-100-50) ps=250 ps. This means that any of the floor (250 ps/15 ps)=16 previous inverter outputs can be used instead of the actual DTC output.

In this example, FREF retiming and CKV gating are enabled when cyclic DTC-TDC structure with three available $FREF_{dly}$ versions 282, 284, 286 are used. In the instance of this example, the output of element 34 is the actual DTC output, but $FREF_{dly,2}$ (284, 288) is used as it is the only metastability-free version available in the safe region 278. The other two $FREF_{dly,1}$ and $FREF_{dly,3}$ lie in hold violation region 276 and setup violation region 280, respectively.

This example shows that the number of the delayed edges required can be reduced from a number equal to the sum of DTC-TDC elements to three. Note that care should be taken in the case where the previous available DTC output is not actually transitioning because the DTC code is smaller than the separation between the actual $FREF_{dly}$ and that available output. In this case, the edge closest to $FREF_{dly}$ and inside the desired metastability region is FREF itself.

Unlike the nonlinearity induced spur case, the TDC quantization spurs cannot be alleviated by random rotation. Two types of solutions are provided to reduce these troublesome spurs for near-integer ADPLL operation, both based on breaking the blinding effect of the TDC. In one embodiment, the four quadrature oscillator phases are alternately used as a TDC clock. This solution, however, entails processing in the CKV domain, which is not desirable in a low-power implementation. In another embodiment, FREF-rate $\Sigma\Delta$ dithering of the FREF edge by virtue of a DTC is used.

In the circuit architecture of the present invention, the DTC is already utilized, which means that no additional custom design is required in order to apply FREF dithering and that DTC code dithering can be applied to dither the $FREF_{dly}$ edge. The additional hardware required comprises a $\Sigma\Delta$ modulator of the desired order that is driven by a pseudo-random input. Careful choice of the modulator order is required because in a MASH implementation of the $\Sigma\Delta$ modulator, an N-order structure outputs 2N−1 binary bits, which means that the DTC-TDC size needs to be increased accordingly to accommodate the range of DTC codes as well the range of $FREF_{dly}$ to CLK separation resolved by the TDC. Therefore, there is a tradeoff between the size overhead of the DTC-TDC and the suppression of fractional spurs related to TDC quantization.

Figure 15:
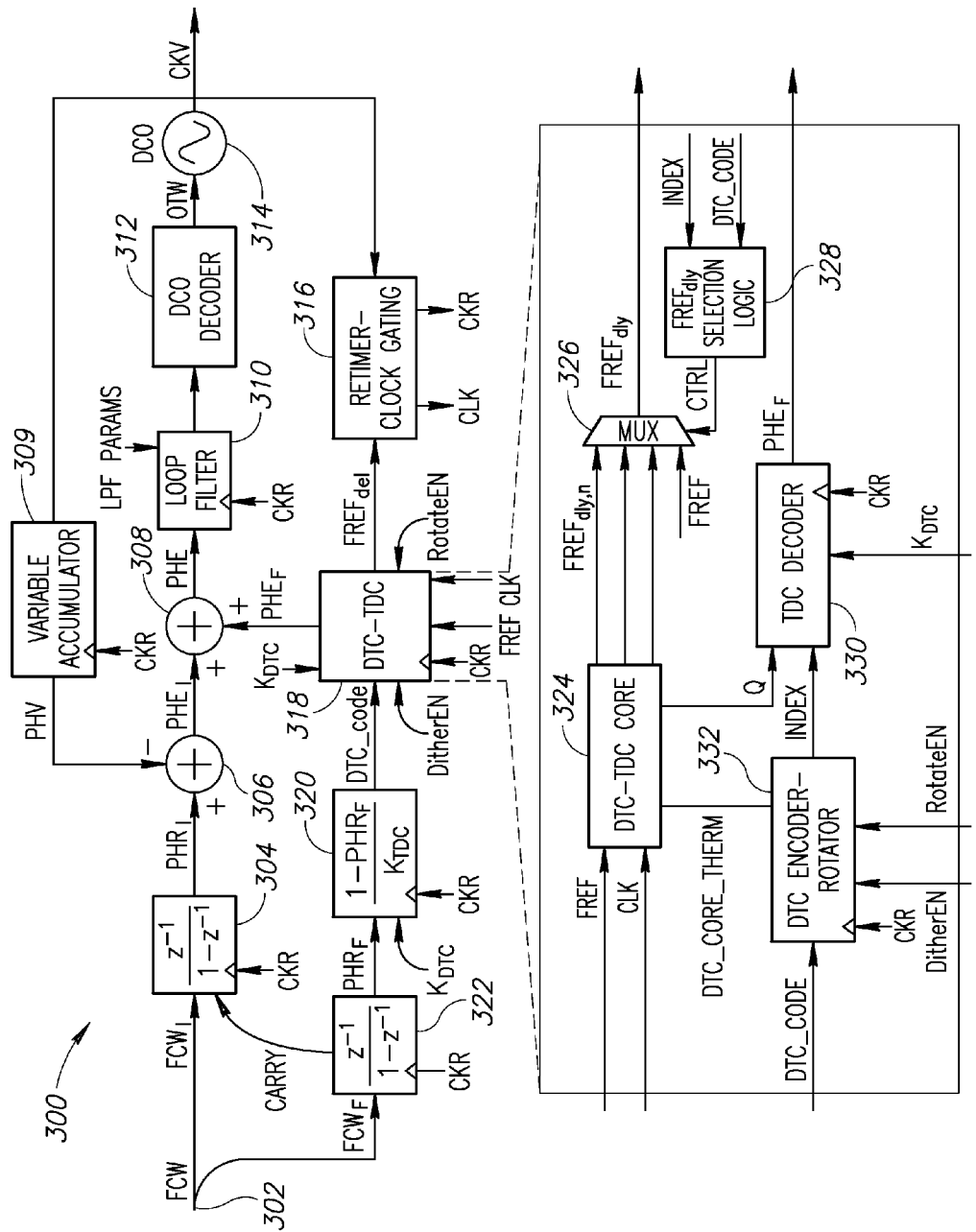
FIG. 15 is a block diagram illustrating an example ADPLL architecture with the cyclic DTC-TCD pair and related encoding/decoding circuit blocks of the present invention.

A block diagram illustrating an example ADPLL architecture with the cyclic DTC-TCD pair and related encoding/decoding circuit blocks of the present invention is shown in FIG. 15. The operation of the ADPLL circuit, generally referenced 300, is similar to that of the ADPLL circuit 170 shown in FIG. 10 and described in detail supra. The ADPLL 300 comprises the cyclic DTC-TDC pair circuit 318, which includes the DTC-TDC core 324, mux 326, DTC encoder-rotator 332, TDC decoder 330 and $FREF_{dly}$ selection logic 328. The various digital blocks surrounding the DTC-TDC core 324 include the following.

The DTC encoder-rotator 332 comprises the LFSR that generates a random index for every reference cycle and/or the input to the $\Sigma\Delta$ modulator for DTC code dithering. The DTC encoder-rotator functions to generate the thermometer DTC code that is generated by the $(1-PHR_F)/K_{DTC}$ operation. If DTC code dithering is on, the output of the $\Sigma\Delta$ modulator is added to the DTC code. If rotation is on, the DTC thermometer code is rotated according to the index so that it can be applied to the DTC-TDC structure (DTC_Code_Therm). The code of elements that are used as the TDC is set to zero so that their set-reset transistors are floating and allow propagation of the transition edges through them. The index value is fed to the TDC decoder 330 and the $FREF_{dly}$ selection circuit 328.

The TDC decoder 330 is operative to read in the output of the flip-flops (Q) that sample the inverter outputs at the gated variable clock (CLK) rising edge. Using the index value, it selects the bits of Q that correspond to the TDC elements and decodes them by identifying the location of two consecutive zeros or ones (i.e. the pulse disturbance). The location of the zeros or ones (TDC_CODE) is converted into the fractional part of the phase error using the following operation:

$$PHE_F=(TDC\_CODE-TDC\_SIZE/2) \cdot K_{DTC} \quad (15)$$

This equation expresses the fact that the middle of the TDC corresponds to the zero value of $PHE_F$ and that $K_{TDC}=K_{DTC}$ since the same type of elements are used for both DTC and TDC circuits.

The $FREF_{dly}$ selection logic 328 uses information about the location of the DTC output (expressed by the index) and the DTC code at the specific reference cycle to control the multiplexer 326 that passes the metastability free delayed version of FREF through to the FREF retimer and TDC gating circuit 316 according to the following conditional logic. If DTC_CODE<(DTC_SIZE/NR_DEL_VERSIONS), then FREF_ret=FREF. If DTC_CODE>(DTC_SIZE/NR_DEL_VERSIONS), then FREF_ret=previous FREF_dly version closest to the current output.

In order to demonstrate the spur reduction potential of the architecture described supra, several behavioral simulations have been carried out. Synthesizable RTL-level code for all the digital parts of the loop have been written in Verilog, as well as behavioral model for the DCO and TDC. For the DCO, oscillator phase noise and frequency output is modeled. A cyclic DTC-TDC has been designed and constructed in 40 nm CMOS process in order to obtain realistic values of the resolution and mismatch. The cyclic DTC-TDC circuit pair was then modeled as a controlled inverter chain. Each inverter i has a delay equal to $\Delta t_i = \Delta t_{mean} + \Delta t_{rand}$, where $\Delta t_{mean}$ is the expected resolution of the cyclic DTC-TDC pair and $\Delta t_{rand}$ is a random value from a Gaussian distribution with a standard deviation σ obtained from Monte-Carlo simulations. The simulation parameters are specified in Table 3 below.

TABLE 3

ADPLL simulation parameters for demonstration of spur reduction

| | |
|---|---|
| Output frequency ($f_c$) | 2400.04 MHz-2440 MHz |
| Reference frequency ($f_R$) | 40 MHz |

TABLE 3-continued

ADPLL simulation parameters for demonstration of spur reduction

| | |
|---|---|
| Oscillator phase noise | −115 dBc/Hz @ 1 MHz offset from carrier |
| DTC-TDC resolution ($\Delta t_{mean}$) | 16.3 ps |
| DTC-TDC standard deviation $\sigma$ | 1.2 ps |
| Loop filter parameters | $\alpha = 2^{-5}, \rho = 2^{-13}$, $[\lambda_1, \lambda_2, \lambda_3, \lambda_4] = [2^{-1}, 2^{-2}, 2^{-2}, 2^{-3}]$ |

Figure 16:
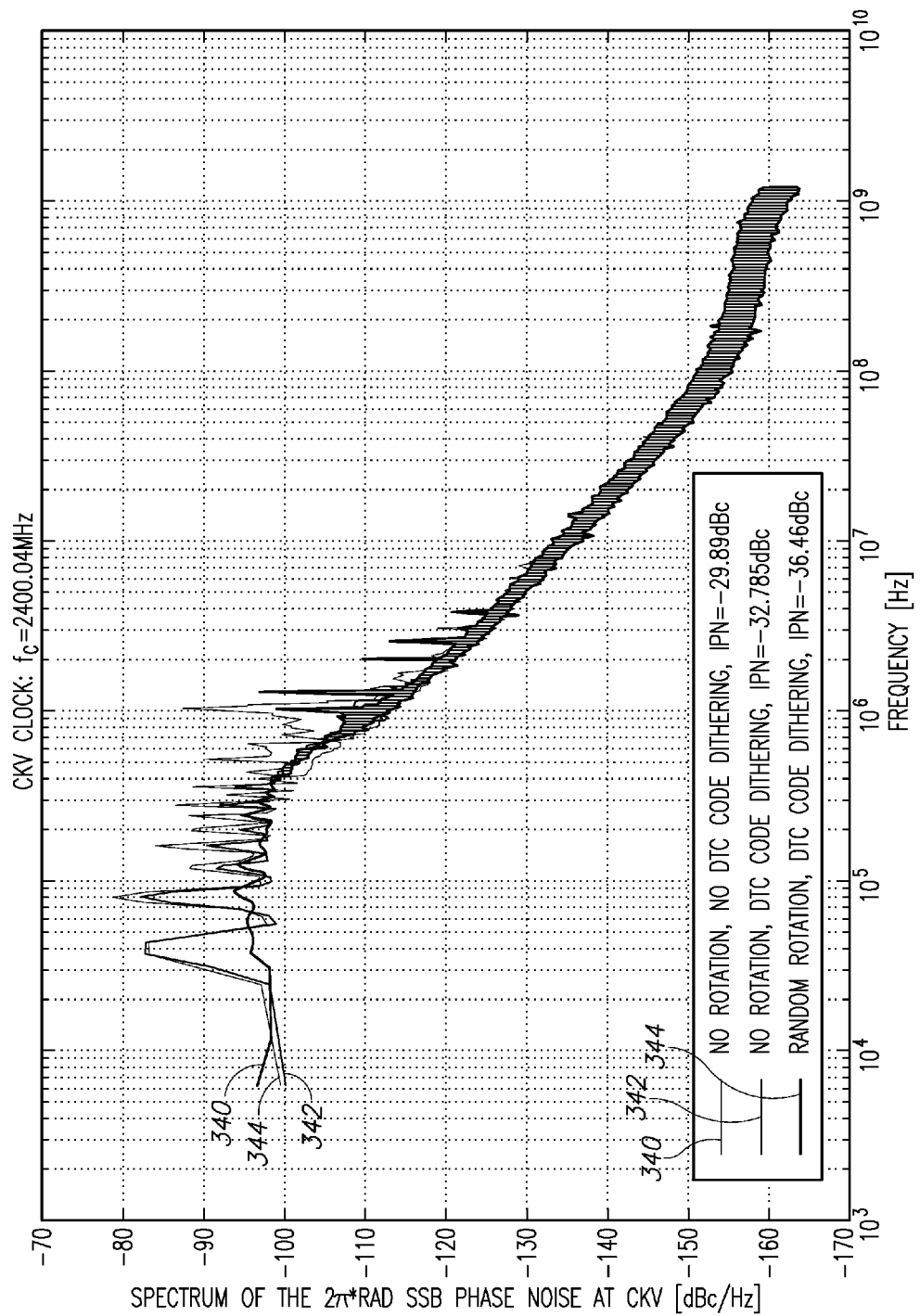
FIG. 16 is a graph illustrating example phase noise spectrum using the cyclic DTC-TDC pair circuit of the present invention.

A graph illustrating example phase noise spectrum using the cyclic DTC-TDC pair circuit of the present invention is shown in FIG. 16. In this example, a channel with output frequency 2400.04 MHz is simulated. In this case FCW=60.001. According to Equations 6 and 7, nonlinearity induced spurs at multiples of 40 kHz and quantization spurs at the vicinity of 1 MHz are expected at the output spectrum, respectively. As shown, rotation by the cyclic DTC-TDC circuit reduces the former spurs and first-order DTC code dithering reduces the latter. In this specific example, the strongest nonlinearity spur is reduced by 14 dB and the fractional spur by more 11 dB, resulting in a reduction of the integrated phase noise from −29.9 dBc (or 1.83°) to −36.46 dBc (or 0.86°). As a reference point, it is noted that the specification for the Wi-Fi/WiMax standard is −35 dBc. The fractionality of the channel was swept in order to obtain the integrated phase noise (IPN) and the highest spur level for two cases. In the first case, no algorithm is applied to the DTC-TDC pair and in the second, random rotation and first order DTC code dithering is applied. Note that the simulations suggest that during operation rotation and dithering can be enabled depending on the channel while maintain truly fractional ADPLL operation with IPN always lower than −36 dBc and a fractional spur always lower than 49 dBc/Hz.

Figure 17:
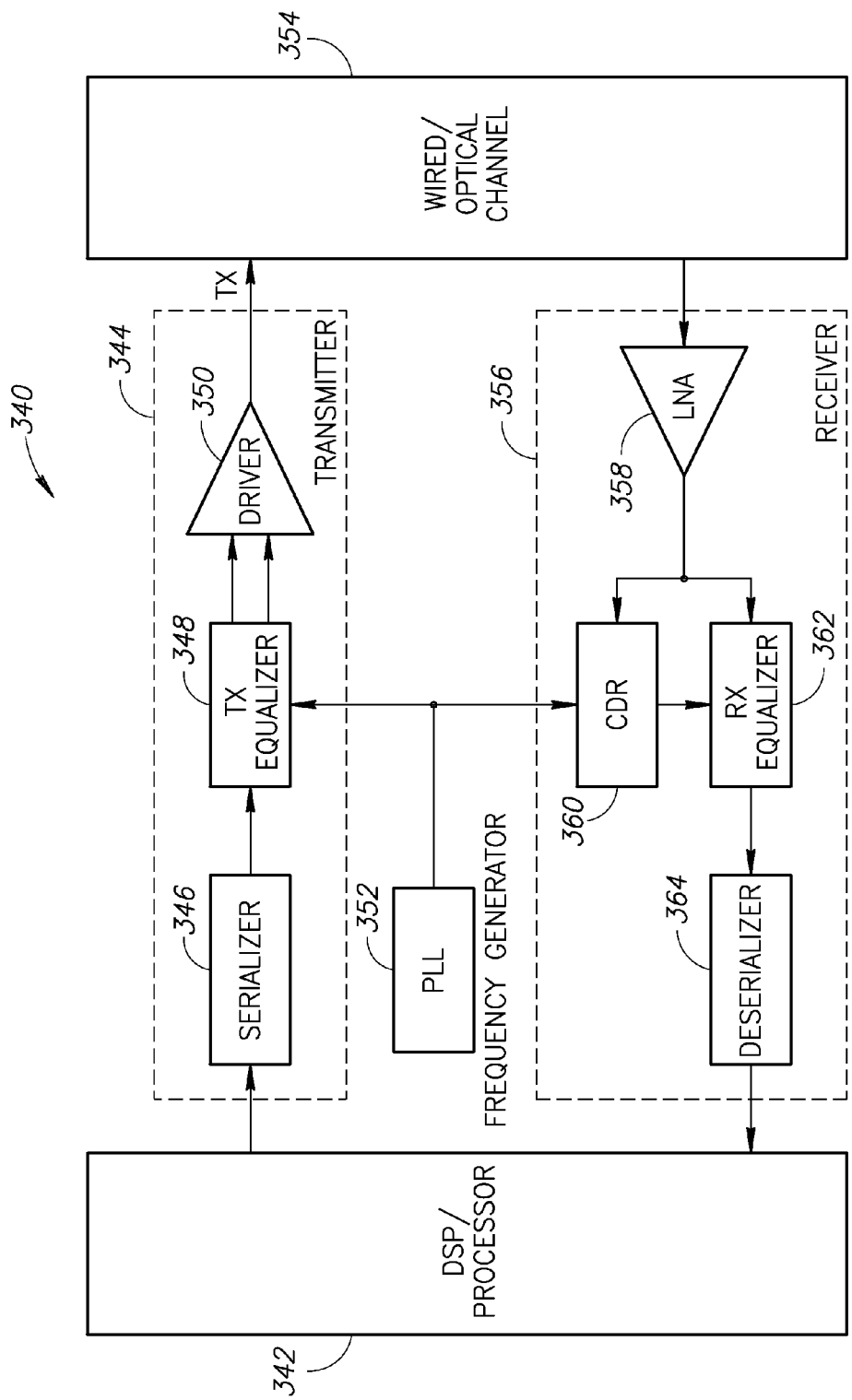
FIG. 17 is a block diagram illustrating an example wireline transceiver incorporating a frequency generator that includes the cyclic DTC-TDC pair circuit of the present invention.

A block diagram illustrating an example wireline transceiver incorporating a frequency generator that includes the look-ahead TDC and/or the cyclic DTC-TDC pair circuit of the present invention is shown in FIG. 17. The transceiver, generally referenced 340, comprises a DSP/processor 342, transmitter 344, receiver 356, ADPLL based frequency generator 352 and the channel (e.g., wired or optical) 354. The transmitter 344 comprises a serializer 346, TX equalizer 348 and driver 350. The receiver 356 comprises a low noise amplifier (LNA) 358, RX equalizer 362, clock data recovery (CDR) block 360 and deserializer 364.

In this example embodiment, the frequency generator 352 comprises an ADPLL incorporating the look-ahead TDC and/or the cyclic DTC-TDC pair circuit of the present invention as described supra in connection with FIGS. 10 and 15.

In an alternative embodiment, the transformer based ADPLL, described in U.S. application Ser. No. 14/831,091 cited supra, is used that incorporates the look-ahead TDC and/or the cyclic DTC-TDC pair circuit of the present invention.

Mobile Device Incorporating the Oscillator

Figure 18:
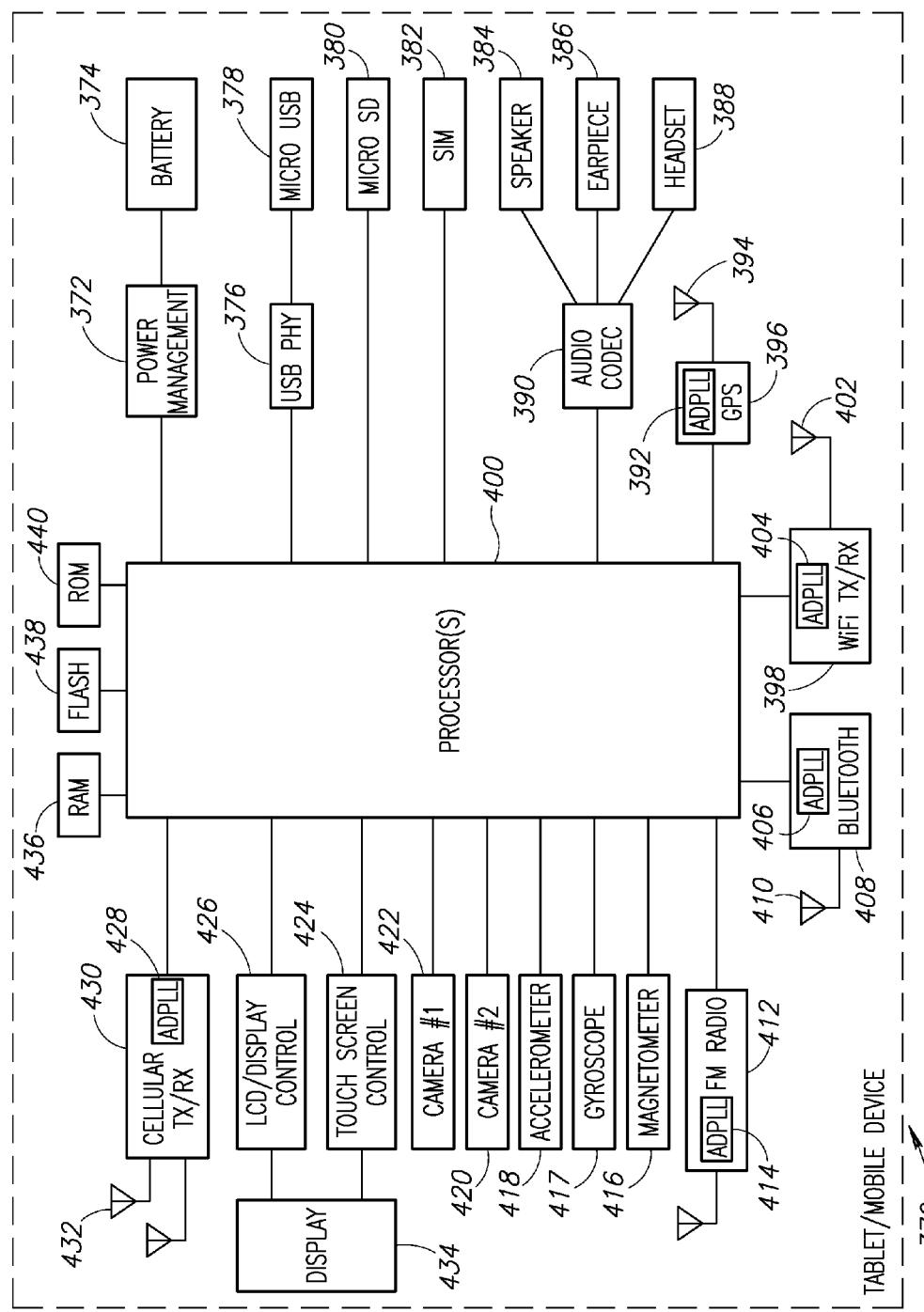
FIG. 18 is a block diagram illustrating an example mobile device incorporating a frequency generator that includes the cyclic DTC-TDC pair circuit of the present invention.

A block diagram illustrating an example tablet/mobile device incorporating a frequency generator that includes the cyclic DTC-TDC pair circuit of the present invention is shown in FIG. 18. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more ADPLL circuits, each incorporating the look-ahead TDC and/or cyclic DTC-TDC pair circuit of the present invention. Numerous embodiments of the mobile device 370 may comprise an ADPLL circuit 428 as described supra incorporated in the one or more cellular radios 430; as ADPLL circuit 414 as described supra incorporated in the FM radio 412; an ADPLL circuit 406 as described supra incorporated in the Bluetooth radio 408; an ADPLL circuit 404 as described supra incorporated in the Wi-Fi radio 398; and an ADPLL circuit 396 as described supra incorporated in the GPS radio 392.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A look-ahead time to digital converter (TDC) for use in an all digital phase locked loop (ADPLL), comprising:
   a plurality of controllable delay elements configured in a sequential chain configuration; and
   a phase prediction circuit coupled to a frequency reference (FREF) clock and operative to predict reference frequency clock edge timing and based thereon to select a number of delay elements in said chain to function as a digital to time converter and a portion of a remainder of delay elements in said chain to function as a time to digital converter.

2. The look-ahead time to digital converter according to claim 1, wherein said plurality of controllable delay elements are operative to generate an output code representing a fractional portion of a phase error used by said ADPLL to adjust the frequency of the variable clock (CKV).

3. The look-ahead time to digital converter according to claim 1, wherein said phase prediction circuit is coupled to a fractional part of a frequency command word (FCW) signal.

4. The look-ahead time to digital converter according to claim 3, wherein said fractional part of FCW signal is accumulated at said FREF clock.

5. A look-ahead time to digital converter (TDC) for use in an all digital phase locked loop (ADPLL) circuit, comprising:
   a look-ahead circuit coupled to a frequency reference (FREF) clock and operative to predict reference frequency clock edge timing and to generate a delayed frequency reference clock therefrom aligned with a variable clock (CKV);
   a plurality of controllable delay elements coupled to said look-ahead circuit, said plurality of delay elements configured in a sequential chain configuration, said delay element chain operative to receive the delayed frequency reference clock and to propagate a single disturbance pulse through a number of delay elements that function as a time to digital converter (TDC);
   wherein said plurality of controllable delay elements are operative to generate an output code representing a fractional portion of a phase error used by said ADPLL to adjust the frequency of the variable clock; and
   wherein one or more delay elements perform a look-ahead function acting as a digital to time converter (DTC) and one or more other delay elements perform a sampling function for resolving a delayed frequency reference clock to variable clock (CKV) time delay.

6. The time to digital converter according to claim 5, wherein each controllable delay element comprises:
   an inverter;
   a pair of reset and set transistors coupled to said inverter and operative to pull up or down a corresponding input node; and
   a latch coupled to an inverter at each intermediate node of said delay element chain.

7. The time to digital converter according to claim 5, wherein a front portion of said delay element chain functions as a DTC to propagate the single disturbance pulse through a desired number of delay elements, wherein a reference frequency input is dynamically selected every reference cycle via set and reset controls coupled to said delay elements.

8. The time to digital converter according to claim 5, wherein the delay elements functioning as a time to digital converter are operative to consecutively go through reset, set and propagation states every frequency reference clock cycle.

9. The time to digital converter according to claim 8, wherein said reset state occurs when the reference frequency clock is low and is operative to set the delayed frequency reference clock to a low state.

10. The time to digital converter according to claim 8, wherein said set state occurs upon rising reference frequency clock edge and is operative to generate the single disturbance pulse at a node from which the propagation of the pulse is to start.

11. The time to digital converter according to claim 8, wherein said single disturbance pulse comprises two consecutive identical logic states.

12. The time to digital converter according to claim 8, wherein the disturbance pulse propagates through a remainder of delay elements in said delay element chain.

13. The time to digital converter according to claim 5, wherein said phase prediction circuit is coupled to a fractional part of a frequency command word (FCW) signal.

14. The time to digital converter according to claim 13, wherein said fractional part of FCW signal is accumulated at said FREF clock.

15. A method of look-ahead time to digital conversion for use in an all digital phase locked loop (ADPLL), the method comprising:

predicting reference frequency (FREF) clock edge timing and generating a delayed frequency reference clock therefrom;

providing a plurality of controllable delay elements configured in a sequential chain configuration; and based on the reference frequency clock prediction, selecting at every frequency reference clock a number of delay elements in said chain to function as a digital to time converter and a portion of a remainder of delay elements in said chain to function as a time to digital converter.

16. The method according to claim 15, further comprising generating an output code representing a fractional portion of a phase error used by said ADPLL to adjust a frequency of a variable clock (CKV).

17. The time to digital converter according to claim 5, further comprising a circuit operative to perform random rotation of said plurality of controllable delay elements such that mismatch error per DTC code averages out to zero thereby causing frequency spurs to scramble into white noise.

18. The time to digital converter according to claim 5, further comprising a circuit operative to randomly select one of said plurality of controllable delay elements to be the start of said DTC.

19. The time to digital converter according to claim 18, wherein a first number of delay elements subsequent to the start of the DTC function as the DTC and a second number of delay elements following those function as the TDC.

20. The time to digital converter according to claim 5, wherein said DTC is operative to provide $\Sigma\Delta$ dithering of frequency reference clock edges thereby reducing TDC quantization frequency spurs.

* * * * *